(12) United States Patent
Manack et al.

(10) Patent No.: US 11,942,386 B2
(45) Date of Patent: Mar. 26, 2024

(54) ELECTRONIC DEVICES IN SEMICONDUCTOR PACKAGE CAVITIES

(71) Applicant: TEXAS INSTRUMENTS INCORPORATED, Dallas, TX (US)

(72) Inventors: Christopher Daniel Manack, Flower Mound, TX (US); Patrick Francis Thompson, Allen, TX (US); Qiao Chen, Flower Mound, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 173 days.

(21) Appl. No.: 17/001,429

(22) Filed: Aug. 24, 2020

(65) Prior Publication Data

US 2022/0059423 A1    Feb. 24, 2022

(51) Int. Cl.
*H01L 23/31*    (2006.01)
*H01L 21/48*    (2006.01)
(Continued)

(52) U.S. Cl.
CPC ........ *H01L 23/315* (2013.01); *H01L 21/4825* (2013.01); *H01L 21/565* (2013.01);
(Continued)

(58) Field of Classification Search
CPC ... H01L 23/3107; H01L 21/565; H01L 24/48; H01L 23/4952; H01L 24/13; H01L 21/4825; H01L 23/49513; H01L 23/315; H01L 23/49575; H01L 24/02; H01L 24/73; H01L 24/16; H01L 23/5389; H01L 24/20; H01L 23/49816; H01L 24/24; H01L 23/3114; H01L 21/4853; H01L 24/82; H01L 24/19; H01L 21/4857; H01L 23/562; H01L 23/3128; H01L 23/49833; H01L 23/3135; H01L 23/49827; H01L 25/0652; H01L 23/49822; H01L 25/50; H01L 23/3142; H01L 23/10; H01L 23/3121; H01L 2224/48245; H01L 2224/13111; H01L 2924/07025; H01L 2924/19104; H01L 2224/16145; H01L 2224/73207;
(Continued)

(56) References Cited

U.S. PATENT DOCUMENTS 5,868,949 A * 2/1999 Sotokawa ......... H01L 23/49894
                                                    428/209
9,640,473 B2 * 5/2017 Sung .................... H01L 23/3128
(Continued)

FOREIGN PATENT DOCUMENTS

WO    2019156695    8/2019

OTHER PUBLICATIONS

PCT Search Report dated Dec. 13, 2021, 2 pages.

*Primary Examiner* — Mouloucoulaye Inoussa
(74) *Attorney, Agent, or Firm* — Dawn Jos; Frank D. Cimino

(57) ABSTRACT

In examples, a semiconductor device comprises a semiconductor package including a mold compound covering a semiconductor die. The semiconductor package has a surface and a cavity formed in the surface. The semiconductor device comprises an electronic device positioned within the cavity, the electronic device coupled to the semiconductor die via a conductive terminal extending through the mold compound.

17 Claims, 20 Drawing Sheets

(51) Int. Cl.
*H01L 21/56* (2006.01)
*H01L 23/00* (2006.01)
*H01L 23/495* (2006.01)

(52) U.S. Cl.
CPC .... *H01L 23/49513* (2013.01); *H01L 23/4952* (2013.01); *H01L 23/49575* (2013.01); *H01L 24/02* (2013.01); *H01L 24/13* (2013.01); *H01L 24/16* (2013.01); *H01L 24/48* (2013.01); *H01L 24/73* (2013.01); *H01L 2224/0239* (2013.01); *H01L 2224/024* (2013.01); *H01L 2224/13082* (2013.01); *H01L 2224/13111* (2013.01); *H01L 2224/13139* (2013.01); *H01L 2224/13147* (2013.01); *H01L 2224/16145* (2013.01); *H01L 2224/48137* (2013.01); *H01L 2224/48245* (2013.01); *H01L 2224/48465* (2013.01); *H01L 2224/73207* (2013.01); *H01L 2924/01028* (2013.01); *H01L 2924/01029* (2013.01); *H01L 2924/01074* (2013.01); *H01L 2924/07025* (2013.01); *H01L 2924/19104* (2013.01)

(58) Field of Classification Search
CPC . H01L 2224/13082; H01L 2224/13139; H01L 2224/024; H01L 2224/13147; H01L 2224/0239; H01L 2224/73265; H01L 2224/48137; H01L 2924/01074; H01L 2224/48465; H01L 2924/01028; H01L 2924/01029; H01L 2224/12105; H01L 2224/16225; H01L 2224/214; H01L 2224/04105; H01L 2224/24226; H01L 2224/92244; H01L 2225/06517; H01L 2924/181; H01L 2224/16235; H01L 2224/83101; H01L 2225/06548; H01L 2224/16227; H01L 2924/1815; H01L 2924/1461; H01L 2224/48091; H01L 2924/00014; B81C 1/00309; B81C 1/00238; B81C 1/00158; B81C 2203/0792; B81C 2203/035; B81B 7/0077; B81B 2201/0271; B81B 2207/07; B06B 1/0629
USPC ... 257/698, 686, E23.18, E21.505, E23.023; 438/109
See application file for complete search history.

(56) References Cited

U.S. PATENT DOCUMENTS

| | | | |
|---|---|---|---|
| 9,831,215 B1* | 11/2017 | Chen | H01L 25/50 |
| 2006/0244157 A1* | 11/2006 | Carson | H01L 25/0652 257/E25.023 |
| 2009/0091015 A1* | 4/2009 | Shen | H01L 24/73 438/109 |
| 2009/0115049 A1* | 5/2009 | Shiraishi | B81C 1/0023 257/E23.18 |
| 2009/0152701 A1* | 6/2009 | Kuan | H01L 25/16 438/109 |
| 2010/0327419 A1* | 12/2010 | Muthukumar | H01L 25/18 257/E25.027 |
| 2012/0292785 A1* | 11/2012 | Pagaila | H01L 23/5384 257/774 |
| 2014/0264808 A1* | 9/2014 | Wolter | H01L 23/3128 257/774 |
| 2015/0069537 A1* | 3/2015 | Lo | G01L 19/0076 438/51 |
| 2016/0247781 A1* | 8/2016 | Sung | H01L 23/3128 |
| 2017/0047308 A1* | 2/2017 | Ho | H01L 23/5386 |
| 2018/0019228 A1 | 1/2018 | Zhang et al. | |
| 2018/0190591 A1* | 7/2018 | Kim | H01L 23/5389 |
| 2018/0350747 A1* | 12/2018 | Hwang | H01L 23/5385 |
| 2019/0043792 A1* | 2/2019 | Weerasekera | H01L 25/0652 |
| 2019/0157190 A1 | 5/2019 | Fuergut et al. | |
| 2020/0211961 A1 | 7/2020 | Khanolkar | |
| 2020/0212006 A1* | 7/2020 | Chang | H01L 25/50 |
| 2020/0235065 A1* | 7/2020 | Chang | H01L 24/16 |

* cited by examiner

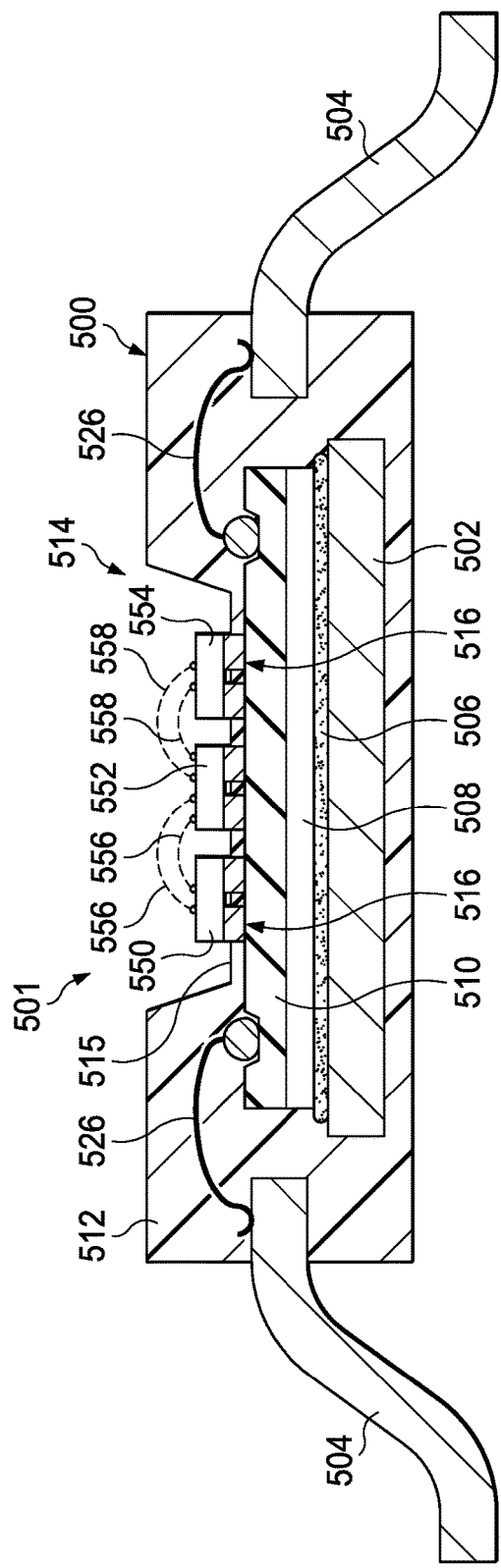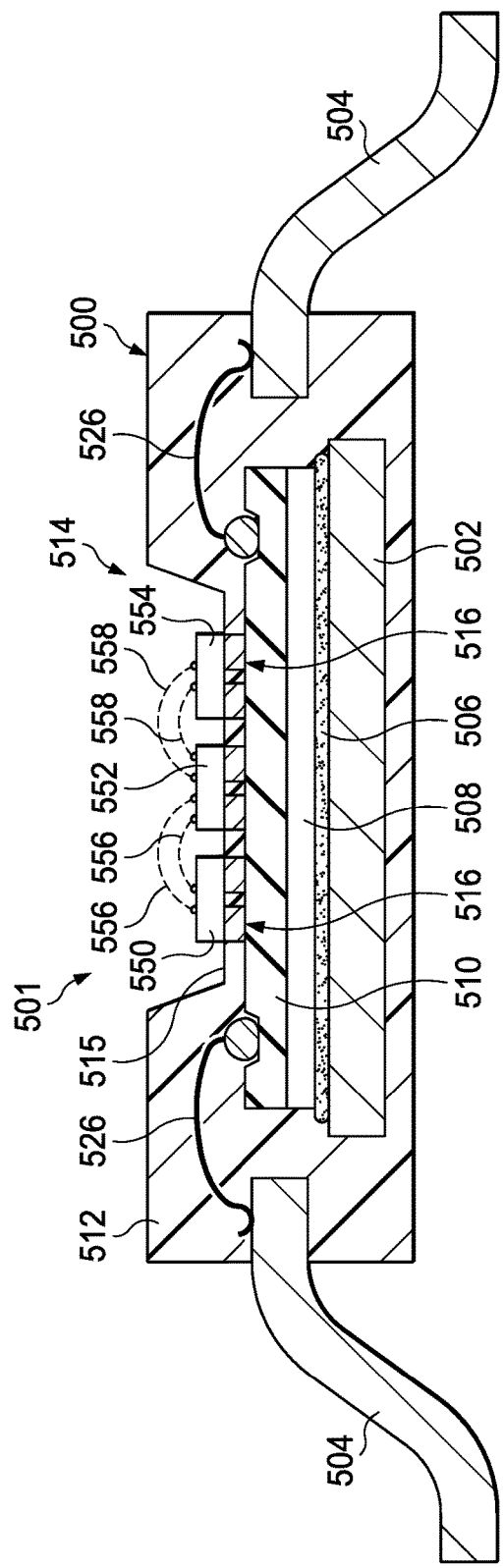
FIG. 5A
FIG. 5D

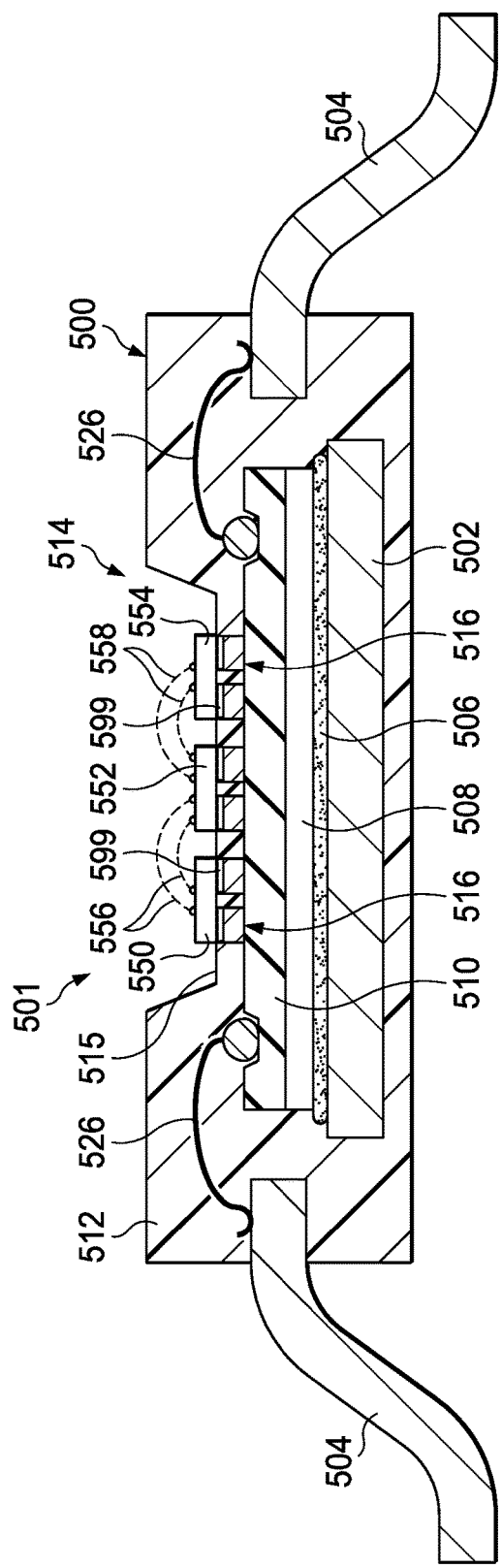
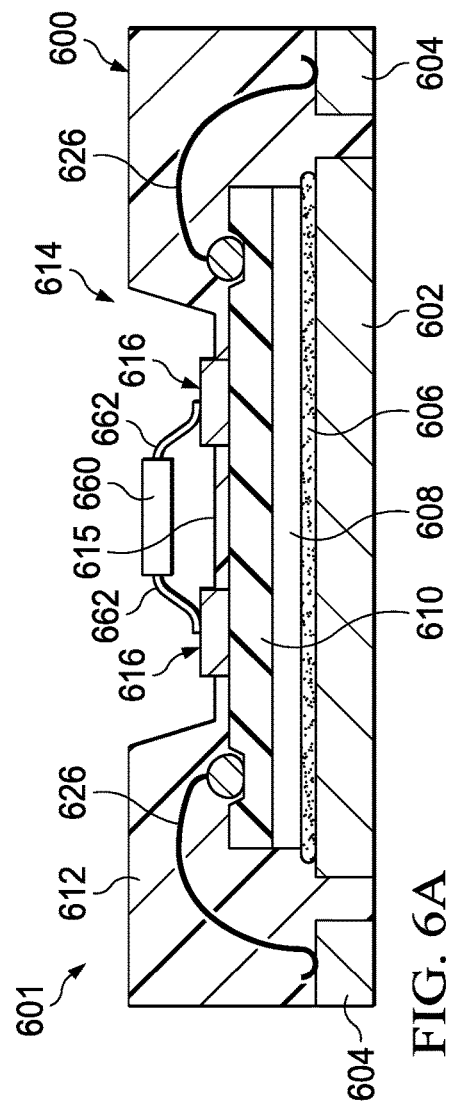
FIG. 5E
FIG. 6A

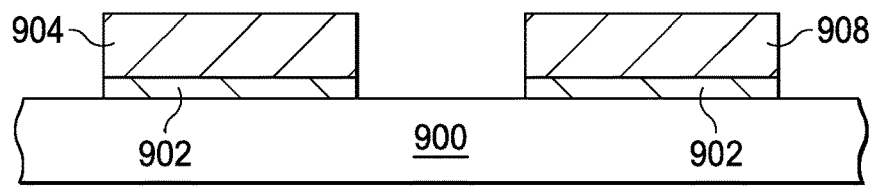
FIG. 9C
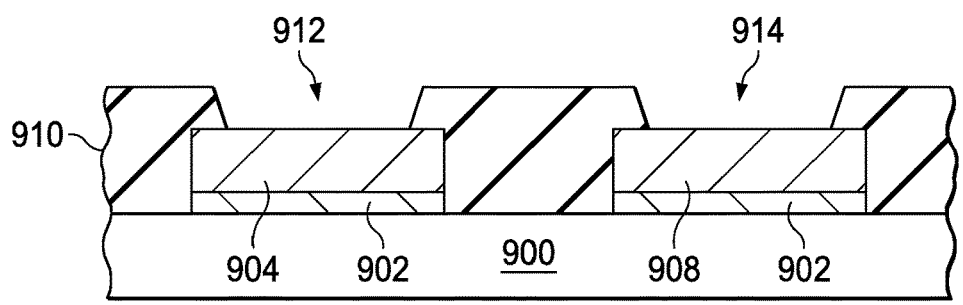
FIG. 9D
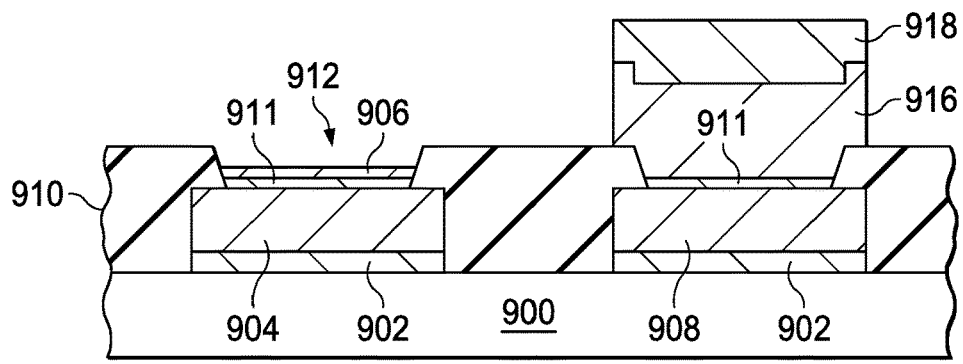
FIG. 9E
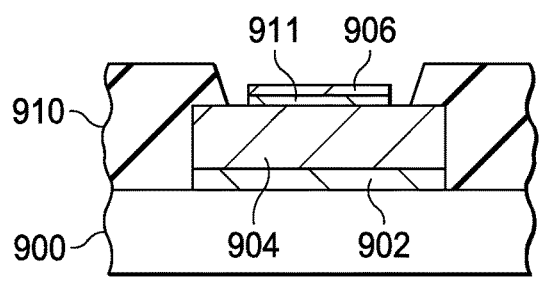
FIG. 9E1
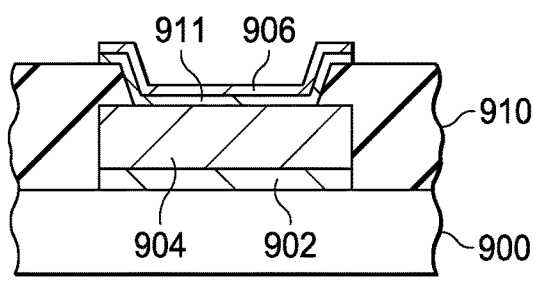
FIG. 9E2

US 11,942,386 B2

ELECTRONIC DEVICES IN SEMICONDUCTOR PACKAGE CAVITIES

BACKGROUND

During manufacture, semiconductor chips (also commonly referred to as "dies") are frequently mounted on die pads of lead frames and are wire-bonded, clipped, or otherwise coupled to leads of the lead frame. Other devices may similarly be mounted on the die pad or on another lead frame pad. The assembly is later covered by a mold compound, such as epoxy, to protect the assembly from potentially damaging heat, physical trauma, moisture, and other deleterious factors. After detachment from its lead frame strip, the finished assembly is called a semiconductor package or, more simply, a package. The conductive terminals (e.g., leads) are exposed to an exterior of the package and are used to electrically couple the packaged chip to devices outside of the package.

SUMMARY

In examples, a semiconductor device comprises a semiconductor package including a mold compound covering a semiconductor die. The semiconductor package has a surface and a cavity formed in the surface. The device also comprises an electronic device positioned within the cavity. The electronic device couples to the semiconductor die via a conductive terminal extending through the mold compound.

In examples, a method comprises coupling an inactive surface of a semiconductor die to a die pad. The method includes forming a redistribution layer (RDL) on an active surface of the semiconductor die. The method comprises coupling an electronic device to a conductive terminal, the conductive terminal coupled to the RDL. The method comprises covering the die pad, the semiconductor die, and the RDL with a mold compound such that the electronic device is positioned in a cavity formed in a surface of the mold compound. The RDL is positioned between the surface and the semiconductor die.

BRIEF DESCRIPTION OF THE DRAWINGS

For a detailed description of various examples, reference will now be made to the accompanying drawings in which:

FIGS. 5A, 5D, and 5E are profile, cross-sectional views of semiconductor packages having cavities, each cavity storing multiple electronic devices, in accordance with various examples.

FIG. 6A is a profile, cross-sectional view of a semiconductor package having a cavity storing another semiconductor package, in accordance with various examples.

FIGS. 9A-9E2 depict a process flow for fabricating a redistribution layer (RDL) in a semiconductor package having a cavity to store an electronic device, in accordance with various examples.

DETAILED DESCRIPTION

Figure 1A:
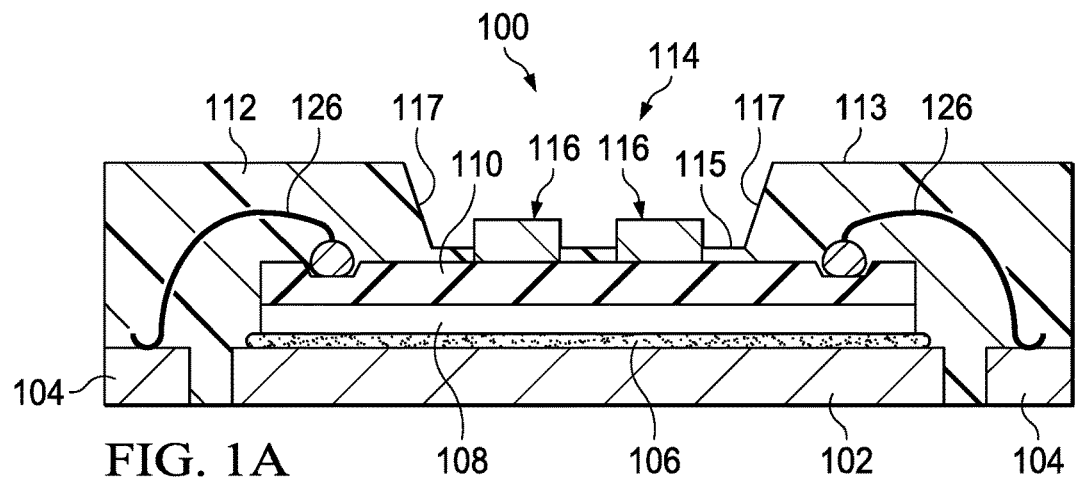
FIGS. 1A, 2A, 3A, and 4A are profile, cross-sectional views of various semiconductor packages having cavities to store electronic devices, in accordance with various examples.

The functionality of a semiconductor package is typically determined by the components housed within the package. In some cases, it is desirable to expand the functionality of a first semiconductor package without increasing the footprint of that semiconductor package. This can be accomplished by stacking other electronic devices, for example a second semiconductor package, on top of the first semiconductor package. Such stacking typically entails coupling the second semiconductor package on top of the first semiconductor package such that the conductive terminals (e.g., balls in a ball grid array (BGA) package) of the second semiconductor package extend through the mold compound that covers the first semiconductor package. Alternatively, the width of the first semiconductor package is reduced relative to the width of the second semiconductor package so that the conductive terminals (e.g., balls) of both the first and second semiconductor packages can reach the underlying printed circuit board (PCB). Although the second semiconductor package is not positioned inside the first semiconductor package, the second semiconductor package is nonetheless said to expand the functionality of the first semiconductor package because it is stacked on top of the first semiconductor package and thus is considered to be part of the first semiconductor package.

Although such configurations can expand the functionality of a semiconductor package, they come with numerous disadvantages. For example, although stacking packages as described above avoids increasing the PCB space occupied, it still increases the volume of the combined package structure, particularly in the vertical direction. In addition, such configurations can be expensive due to the complex manufacturing process involved in assembling the stacked packages. Furthermore, the stacked package configuration results in poor electrical properties due to the increase in distance that electrical signals travel, and it results in poor thermal properties because the top semiconductor package blocks and traps heat being radiated by the bottom semiconductor package.

This disclosure describes a semiconductor device that includes a semiconductor package and an electronic device (e.g., another semiconductor package, a passive component). The semiconductor package includes a mold compound that comprises a cavity formed in a top surface of the mold compound. The electronic device is positioned inside the cavity and electrically couples to circuitry inside the semiconductor package via one or more conductive terminals that extend into (or are exposed to) the cavity from within the semiconductor package. This semiconductor device presents numerous advantages over the stacked package configuration described above. For example, because the electronic device partially or entirely fits within the cavity of the semiconductor package, the volume of the resulting structure is the same as, or is not substantially greater than, the volume of the semiconductor package alone. In addition, the semiconductor device is inexpensive and efficient to manufacture. Furthermore, electrical signals are exchanged between the electronic device and the semiconductor package by way of a redistribution layer (RDL) positioned between the electronic device and the semiconductor die of the semiconductor package, thereby mitigating significant increases in distance traveled by the electrical signals and preserving electrical performance. Further still, because the electronic device is positioned within the cavity of the semiconductor package, both the electronic device and the semiconductor package are able to efficiently dissipate heat.

In addition, the examples described herein are also advantageous over stacked die packages, in which multiple dies are covered by a common mold compound. In a stacked die package, the functionality provided by the package is limited to that provided by the dies that are already covered by the mold compound. The functionality of the completed package cannot be changed. In contrast, the examples described in this disclosure provide one or more dies within the package that can couple to any of a variety of electronic devices that are positioned outside of the package, e.g., in a cavity of the package. As a result, a user may purchase a package having the cavity and conductive terminals described herein and may have the flexibility to choose any suitable electronic device that he or she wishes to couple to the package. The user may choose, for example, to couple any suitable package, active component, passive component, etc. to the conductive terminals in the cavity. In this way, the user has greater flexibility to control the functionality of the resulting semiconductor device than he or she would have with a stacked die package, the functionality of which is predetermined. The semiconductor device is now described in relation to the drawings.

FIGS. 1A, 2A, 3A, and 4A are profile, cross-sectional views of various semiconductor packages having cavities to store electronic devices, in accordance with various examples. Specifically, FIG. 1A depicts an example semiconductor package 100 comprising a die pad 102, conductive terminals 104 (e.g., leads), and a semiconductor die 108 having an inactive surface coupled to the die pad 102 by way of a die attach layer 106. An RDL 110 is formed on an active surface of the semiconductor die 108. The RDL 110 includes, for example, various metals formed in a suitable pattern to enable communications between the active surface of the semiconductor die 108 and other components. The conductive contacts of these patterned metals are defined by dielectrics such as polyimide and/or polybenzoxazole, meaning that the areas of the patterned metals abutting dielectric material do not conduct to other metals, and areas of the patterned metals not abutting dielectric material may conduct to other metals. Although an RDL refers to a patterned metal, this description describes the dielectrics (e.g., polyimide, polybenzoxazole) as being part of the RDLs described herein because the dielectrics define the conductive contacts of the patterned metals.

For instance, by way of the RDL 110 and bond wires 126, the active surface of the semiconductor die 108 couples to the conductive terminals 104, as shown. In addition, by way of the RDL 110, conductive terminals 116 couple to the active surface of the semiconductor die 108. In some examples, the conductive terminals 116 extend from the RDL 110, through a mold compound 112, and into a cavity 114. In other examples, the conductive terminals 116 do not extend into the cavity 114 but are exposed to the cavity 114, meaning that the distal ends of the conductive terminals 116 are not covered by the mold compound 112 and thus are accessible from within the cavity 114. For example, the distal ends of the conductive terminals 116 may be flush with a bottom surface 115 of the cavity 114 or may be positioned lower than the bottom surface 115. In examples, the cavity 114 and the conductive terminals 116 are positioned in a central location of the semiconductor package 100 (e.g., between the bond wires 126), because positioning the conductive terminals 116 to the left or to the right relative to their positions in FIG. 1A would result in the accommodation of fewer bond wires 126. For example, if the cavity 114 and the conductive terminals 116 were shifted to the left, the bond wire 126 shown on the left side of the semiconductor package 100 would have to be omitted, thereby reducing the input and output signaling capabilities of the semiconductor package 100. For at least this reason, the centralized location of the cavity 114 and the conductive terminals 116 facilitates a high conductive terminal (e.g., lead or pin) count. In examples, the outer perimeter of the cavity 114 is spaced at least 50 microns away from adjacent bond pads on the RDL 110 to which the bond wires 126 couple. The mold compound 112 covers the various structures shown in FIG. 1A, such as the die pad 102, the conductive terminals 104, the die attach layer 106, the semiconductor die 108, the RDL 110, and the bond wires 126. The cavity 114 is formed in a top surface 113 of the mold compound 112.

The cavity 114 may have any suitable shape and size. In examples, the bottom surface 115 has a sufficiently large area to accommodate one or more electronic devices, for example, other packages (e.g., ball grid array (BGA) packages, dual in-line packages (DIP), quad flat no-lead (QFN) packages, wafer chip scale packages (WCSP), etc.), passive components (e.g., capacitors, resistors, inductors, transformers), active components (e.g., transistors, amplifiers), etc. The scope of this disclosure is not limited to any particular type of electronic device that may be positioned in the cavity 114. Any suitable electronic device may be positioned in the cavity 114 and coupled to the conductive terminals 116 to establish power and/or data communication with the semiconductor die 108 via the RDL 110. In examples, the length of the surface 115 ranges from 0.1 mm to 20 mm, and the width of the surface 115 ranges from 0.1 mm to 20 mm. In examples, a depth of the cavity 114, as measured from the surface 115 to the horizontal plane of the surface 113, ranges from 0.05 mm to 2 mm. In examples, the length and/or width of the surface 115 has a limit equivalent to the corresponding length and/or width of the surface 113 minus the sum of 1) 200 microns and 2) the product of 2* sin(x)*a depth of the cavity 114, where x is the angle between the wall 117 and a vertical plane extending through the wall 117. This limit may protect the integrity of the mold compound 112 at a periphery of the semiconductor package 100, while an excessively large cavity that thins the mold compound 112 near the periphery of the semiconductor package 100 may cause the mold compound 112 to crumble. In examples, the cavity 114 is sufficiently large so that an electronic device positioned inside the cavity 114 and coupled to the conductive terminals 116 fits entirely within the cavity 114, e.g., the electronic device does not extend beyond the horizontal plane of the surface 113. The various possible dimensions of the cavity 114 are not mere design choices, but rather have specific advantages and disadvantages associated therewith. For example, larger cavities 114 may accommodate additional electronic devices, but associated drawbacks include increased costs and longer manufacturing time, as well as larger package sizes that result in coefficient of thermal expansion (CTE) mismatch problems and problems with alignment between the package and a printed circuit board on which the package is mounted (commonly referred to as coplanarity problems). Similarly, smaller cavities 114 may mitigate the cost, manufacturing time, CTE, and coplanarity problems mentioned above, but associated drawbacks include reduced space to accommodate additional electronic devices. Surfaces 117 are sloping surfaces, but in examples, the surfaces 117 are vertical surfaces.

The semiconductor package 100 is depicted as being a QFN package. However, the scope of this disclosure encompasses all types of packages. For example, a cavity 114 may be formed in a top surface of BGA packages, DIPs, QFN packages, power packages, small outline packages (SOP), etc. Further, the configuration of structures inside the semiconductor package may vary, possibly depending on the type of package used. For example, clips, vias, balls, etc. may be used in lieu of bond wires 126. The RDL 110 may be designed as desired and using any suitable pattern to achieve appropriate communications and/or power transfer between the active surface of the semiconductor die 108 and, e.g., the conductive terminals 116, bond wires 126, etc.

The conductive terminals 116 are depicted as rectangular members and as a pair. In examples, however, each conductive terminal 116 may have any suitable shape, for example, a sphere, a rectangular prism, or an irregular shape. In addition, more or fewer than two conductive terminals 116 may be included. Depending on the metallization pattern of the RDL 110, the conductive terminals 116 may couple to a surface of the RDL 110 (e.g., as shown in FIG. 1A) or may be at least partially positioned inside the RDL (e.g., as shown in FIG. 2A).

Figure 1B:
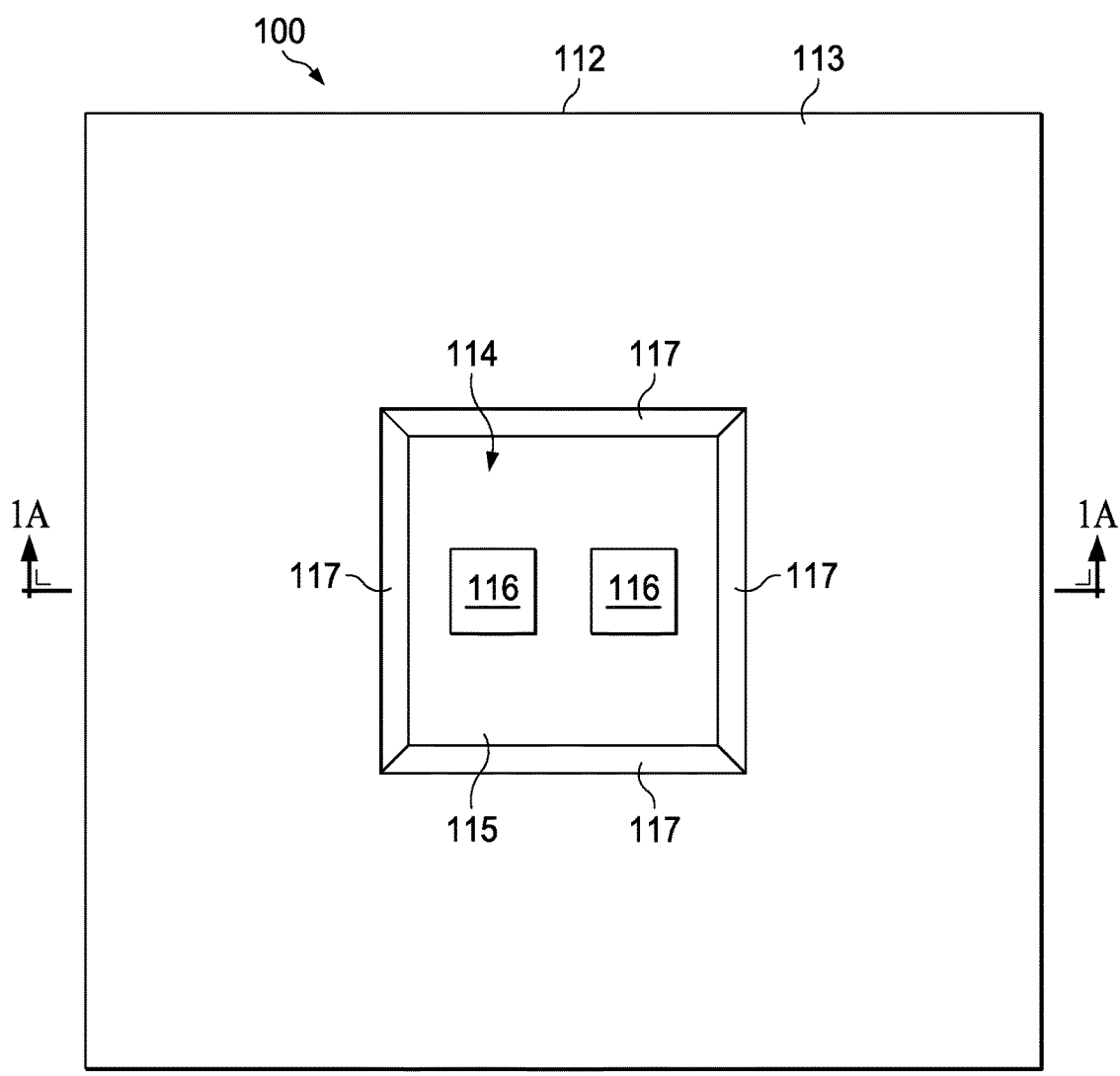
FIGS. 1B, 2B, 3B, and 4B are top-down views of semiconductor packages having cavities to store electronic devices, in accordance with various examples.
Figure 1C:
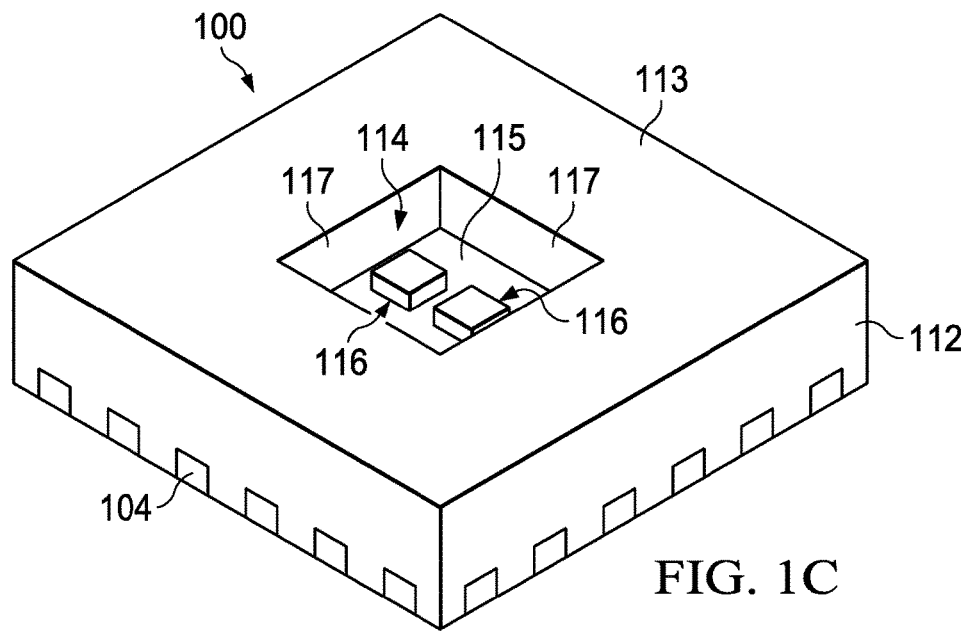
FIGS. 1C, 2C, 3C, and 4C are perspective views of semiconductor packages having cavities to store electronic devices, in accordance with various examples.
Figure 1D:
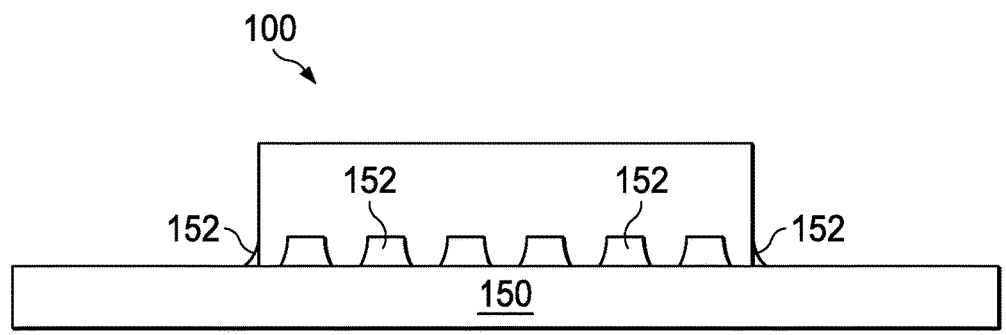
FIG. 1D shows a semiconductor package positioned on a printed circuit board, in accordance with various examples.

FIG. 1B depicts a top-down view of the semiconductor package 100. FIG. 1C depicts a perspective view of the semiconductor package 100. FIG. 1D shows the semiconductor package 100 positioned on an example printed circuit board (PCB) 150 such that the conductive terminals 104 couple to the PCB 150 via solder joints 152. The conductive terminals 104 provide a pathway for the PCB 150 and the semiconductor die 108 within the semiconductor package 100 to exchange signals with each other.

Figure 2A:
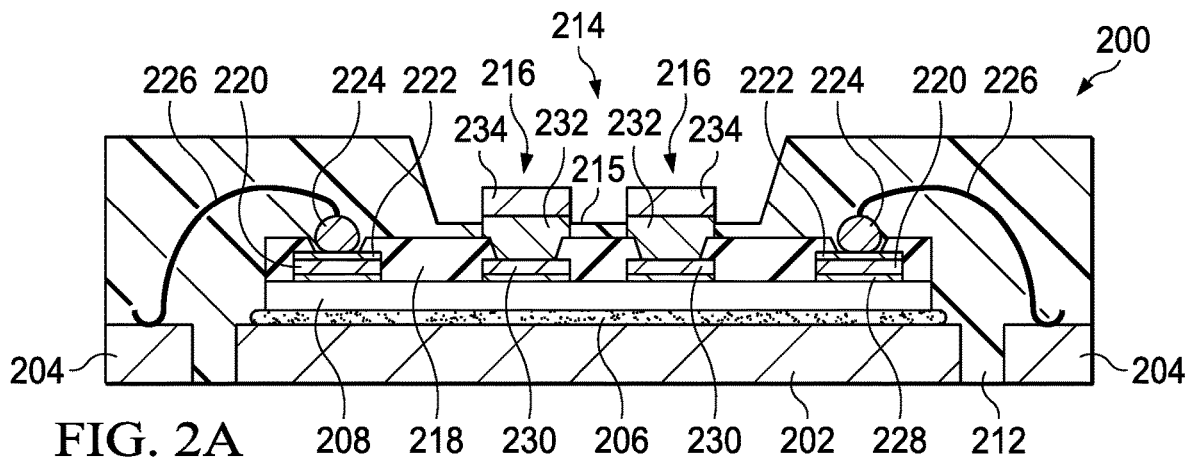

FIG. 2A depicts an example semiconductor package 200. The semiconductor package 200 comprises a die pad 202, conductive terminals 204 (e.g., leads), a die attach layer 206 positioned on the die pad 202, and a semiconductor die 208 positioned on the die attach layer 206. Seed layers 228 are positioned on portions of an active surface of the semiconductor die 208. The seed layers 228 comprise, for example, titanium tungsten or copper. Metal layers 220 (e.g., copper) provide an electrical communication pathway between the active surface of the semiconductor die 208 and wirebond balls 224. The wirebond balls 224, in turn, couple to bond wires 226, which, in turn, couple to conductive terminals 204. Similarly, metal layers 230 (e.g., copper) provide an electrical communication pathway between the active surface of the semiconductor die 208 and conductive terminals 216. Although the metal layers 220, 230 are depicted herein as being rectangular prisms, the shapes and sizes of the metal layers 220, 230 may be configured as desired to form a metallization layer that couples various areas of the active surface of the semiconductor die 208 to other components (e.g., the wirebond balls 224 and conductive terminals 216) as desired. The metal layers 220 are capped by plating layers 222 (e.g., nickel palladium, nickel tungsten). A dielectric layer 218 abuts the metal layers 220, 230 and the conductive terminals 216, as shown. Together, the seed layers 228, the metal layers 220, 230, the plating layers 222, and the dielectric layer 218 form an RDL, such as the RDL 110 described with respect to FIG. 1A above. As explained above, the term RDL does not typically include dielectrics, but for purposes of simplicity and clarity of explanation, the RDLs described herein are said to include dielectrics, such as the dielectric layer 218. A mold compound 212 covers the die pad 202, conductive terminals 204, die attach layer 206, semiconductor die 208, and the RDL of FIG. 2A.

The conductive terminals 216 include metal posts (e.g., copper) 232 that are capped with plating layers 234 (e.g., tin silver). The conductive terminals 216 couple to the metal layers 230 and are partially positioned within a cavity 214. Accordingly, the conductive terminals 216 may be said to extend from the RDL, through mold compound 212, and into the cavity 214. In examples, however, the conductive terminals 216 do not extend into the cavity 214 but are exposed to the cavity 214, meaning that the distal ends of the conductive terminals 216 are not covered by the mold compound 212 and thus are accessible from within the cavity 214. In such examples, the distal ends of the conductive terminals 216 may be flush with a bottom surface 215 of the cavity 214 or may be recessed below the bottom surface 215 of the cavity 214.

In some examples, the conductive terminals 216 have lengths ranging from 50 microns to 1 mm, widths ranging from 50 microns to 1 mm, and heights ranging from 10 microns to 100 microns. The scope of this disclosure is not limited to these specific dimensions. The various possible dimensions of the conductive terminals 216 are not mere design choices, but rather have specific advantages and disadvantages associated therewith. For example, larger conductive terminals 216 may result in improved electrical and thermal performance due to a larger conductive area, but associated drawbacks include lessened coplanarity during manufacture. Similarly, smaller conductive terminals 216 may improve coplanarity, but associated drawbacks include worsened electrical and thermal performance. Likewise, a greater number of conductive terminals 216 provides the ability to couple more electronic devices and/or greater flexibility in terms of electrical access to the semiconductor die 208, but occupies more space in the cavity 214. Conversely, fewer conductive terminals 216 result in less flexibility and a diminished number of electronic devices that may be coupled, but less space is occupied in the cavity 214.

Figure 2B:
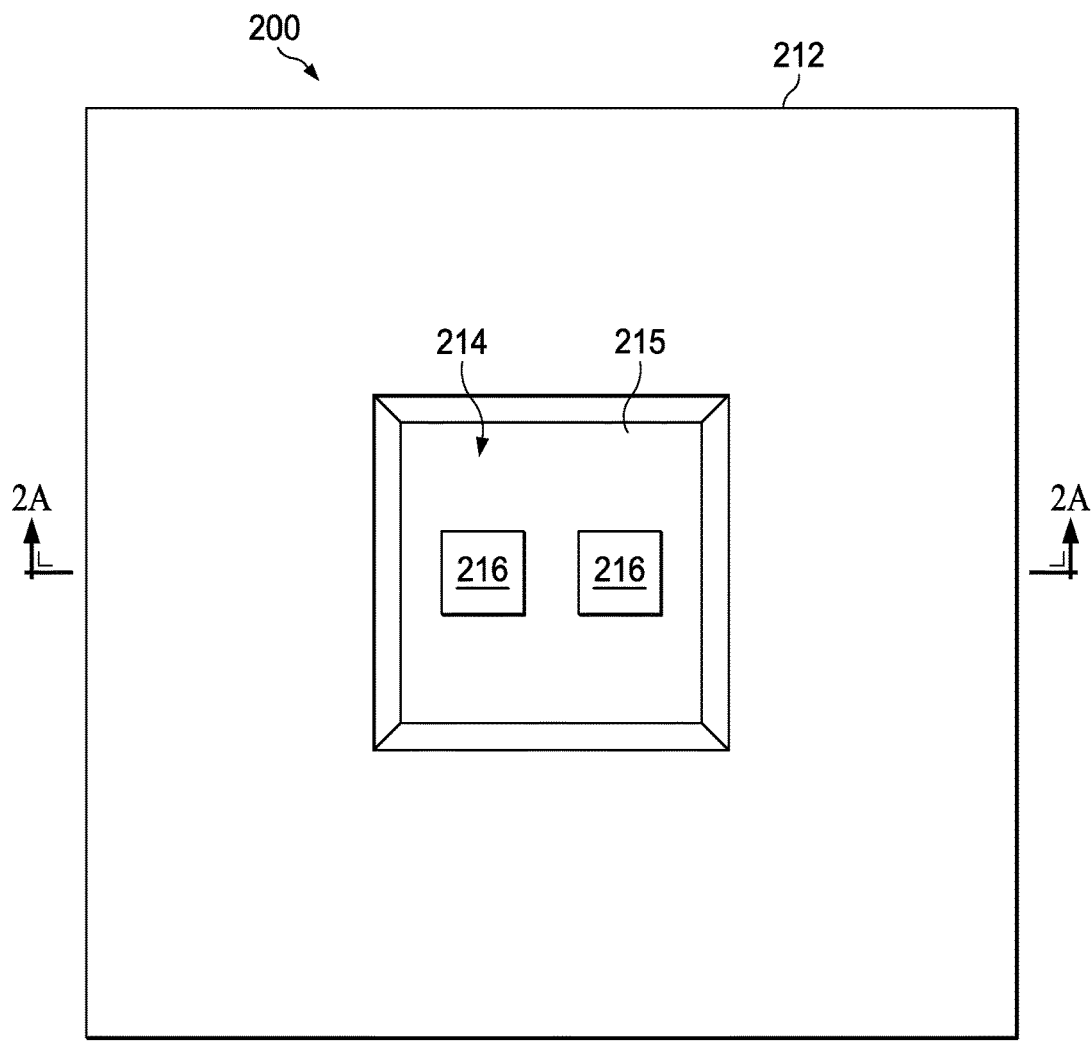
Figure 2C:
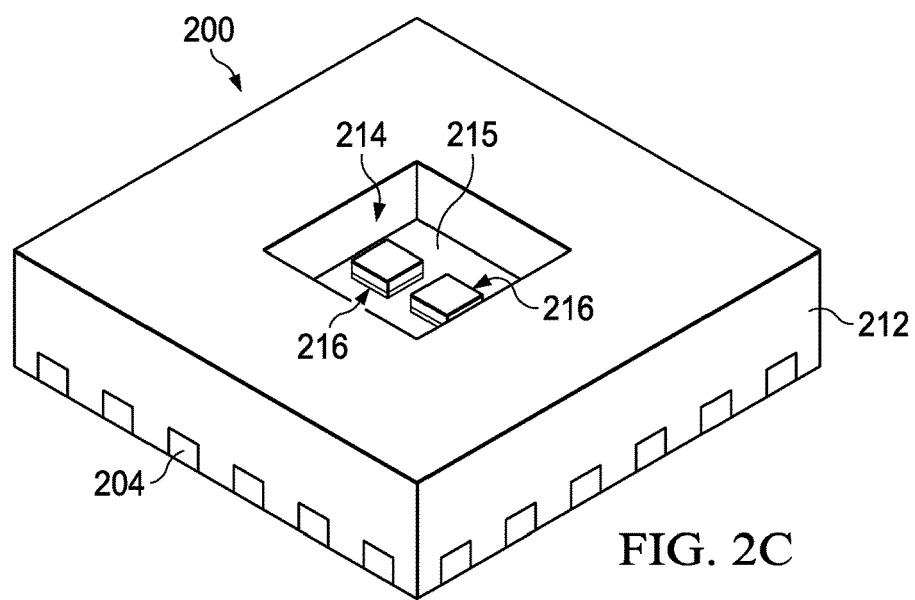

FIG. 2B depicts a top-down view of the semiconductor package 200. FIG. 2C depicts a perspective view of the semiconductor package 200. Although not expressly shown in FIGS. 2A-2C, electronic devices, such as those described above, may be coupled to the conductive terminals 216 as desired. An example process for fabricating the semiconductor package 200 is described below.

Figure 3A:
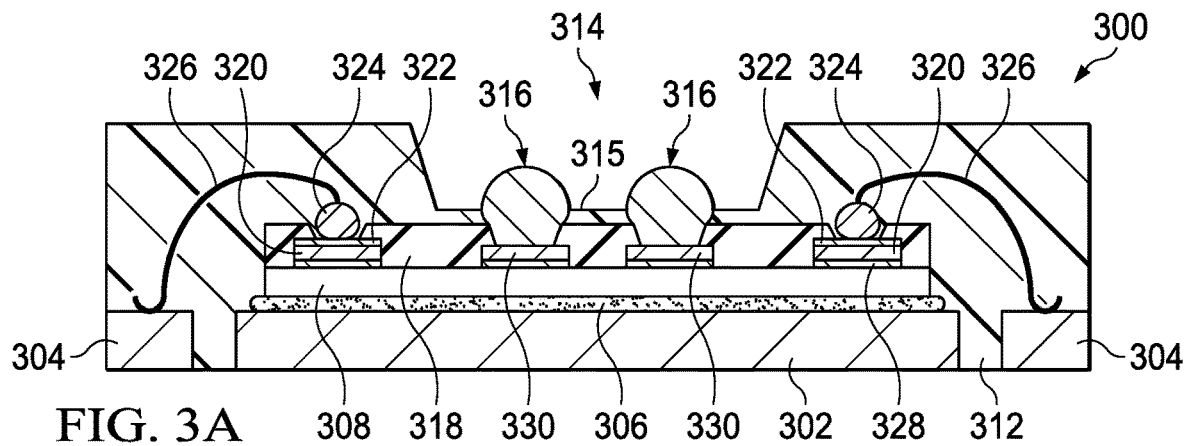
Figure 3B:
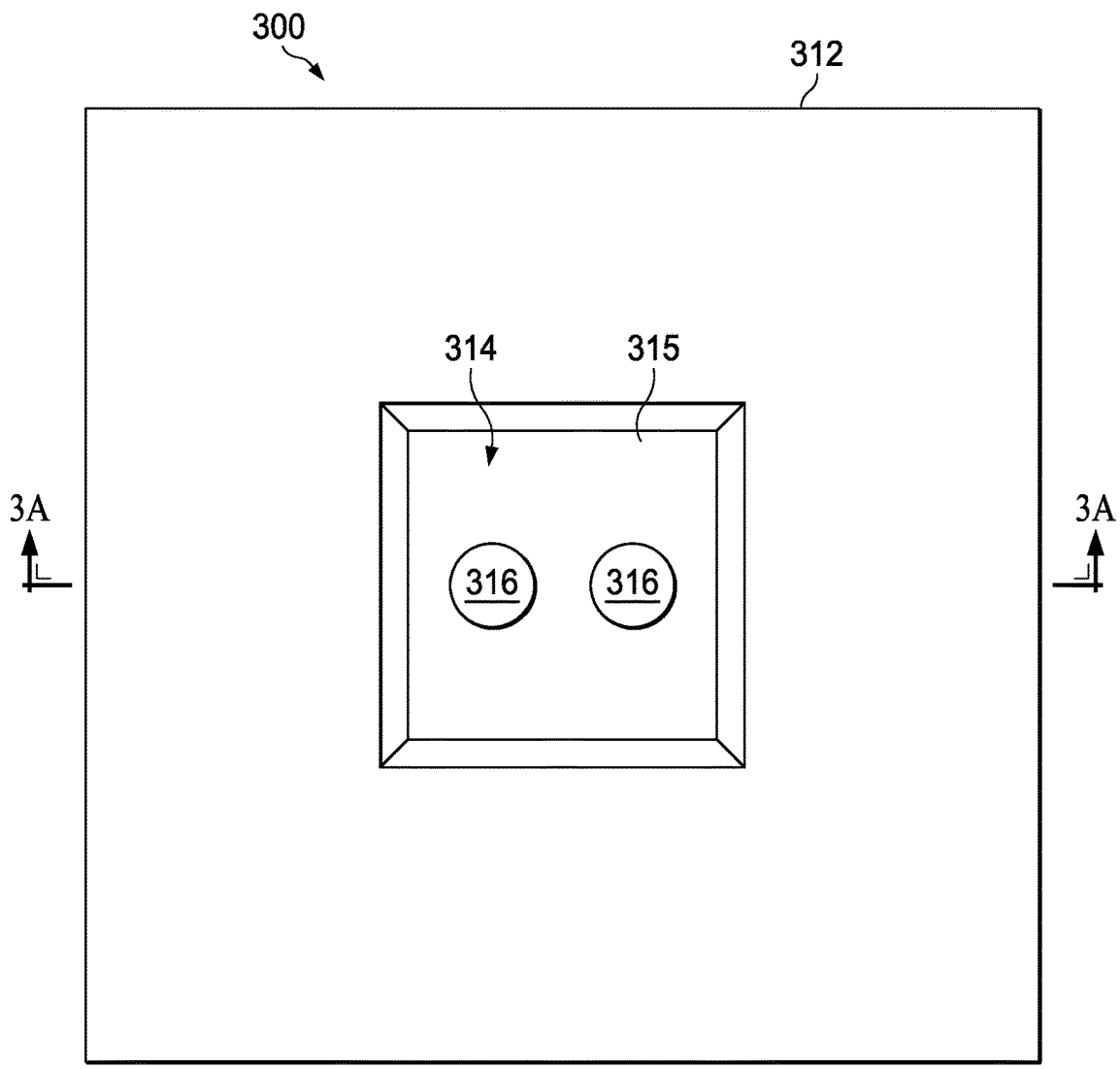
Figure 3C:
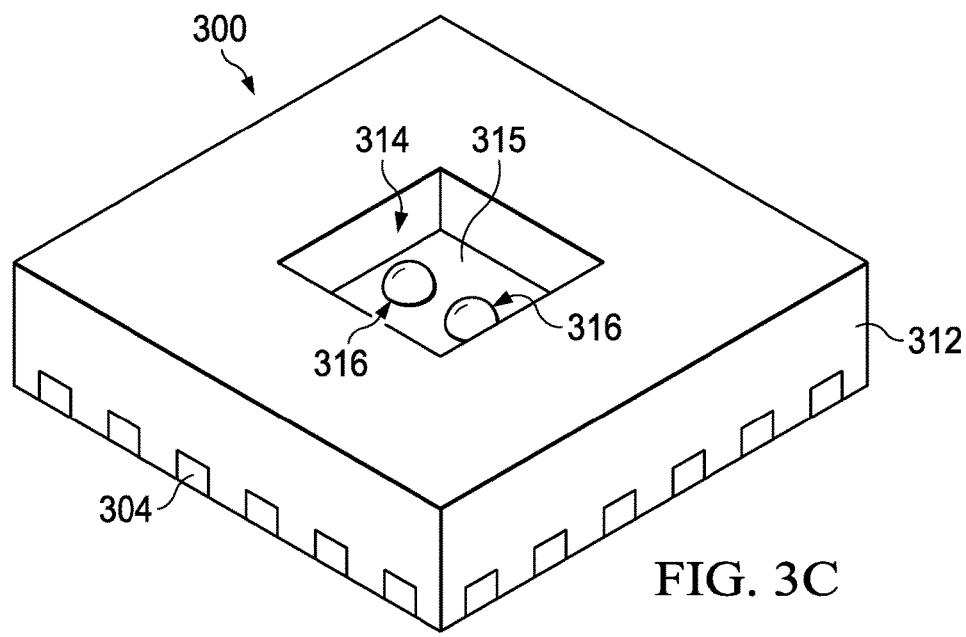

FIG. 3A depicts a profile cross-sectional view of a semiconductor package 300. The semiconductor package 300 is virtually identical to the semiconductor package 200, with like numerals referring to like components (e.g., a die pad 302 in FIG. 3A is identical to the die pad 202 in FIG. 2A; conductive terminals 304 in FIG. 3A are identical to the conductive terminals 204 in FIG. 2A, and so on), except that the semiconductor package 300 includes conductive terminals 316 that are spherical or semi-spherical. The conductive terminals 316 couple to the metal layers 330 and extend through the mold compound 312 and into the cavity 314. In examples, the conductive terminals 316 are composed of solder. In examples, the conductive terminals 316 are composed of another metal or metal alloy. In examples, the diameter of each of the conductive terminals 316 ranges from 100 microns to 500 microns, although other diameters are contemplated and included in the scope of this disclosure. FIG. 3B depicts a top-down view of the semiconductor package 300. FIG. 3C depicts a perspective view of the semiconductor package 300. An example process for fabricating the semiconductor package 300 is described below.

Figure 4A:
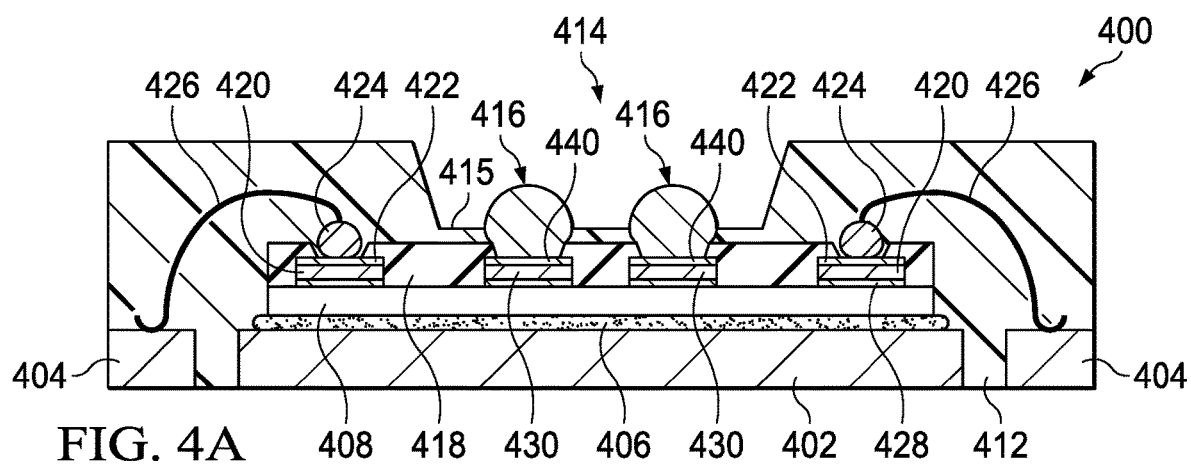
Figure 4B:
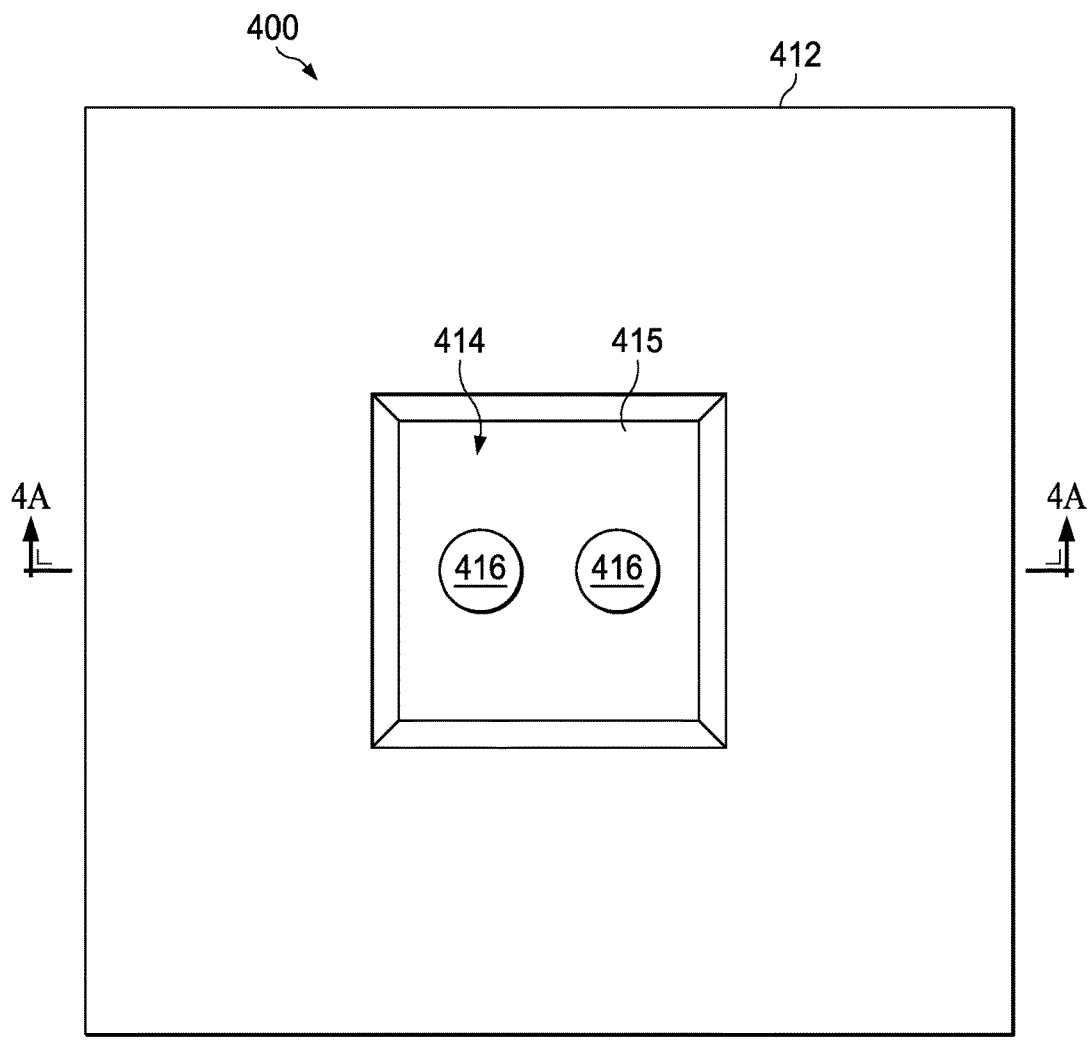
Figure 4C:
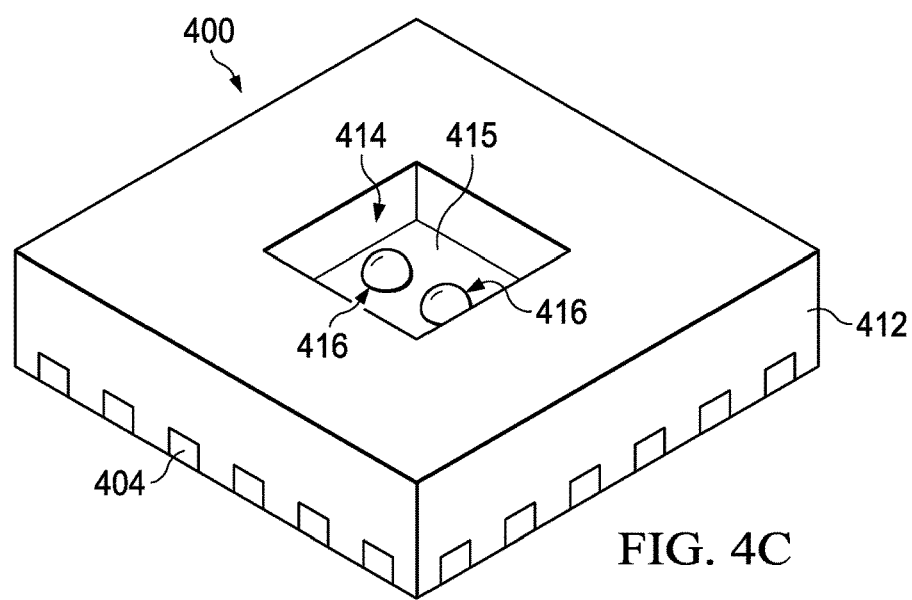

FIG. 4A depicts a profile cross-sectional view of a semiconductor package 400. The semiconductor package 400 is virtually identical to the semiconductor package 300, with like numerals referring to like components, except that the semiconductor package 400 includes plating layers 440 (e.g., nickel palladium, nickel tungsten) capping the metal layers 430, as shown. The plating layers 440 serve as a bond pad finish. FIG. 4B depicts a top-down view of the semiconductor package 400. FIG. 4C depicts a perspective view of the semiconductor package 400.

FIG. 5A is a profile, cross-sectional view of a semiconductor device 501 comprising a semiconductor package 500 and multiple electronic devices 550, 552, 554. The semiconductor package 500 is depicted as being a DIP style package with gullwing conductive terminals 504. As is true for the semiconductor packages 100-400, however, the semiconductor package 500 is not limited to implementation as a DIP package and instead may be implemented as any suitable type of package, for example, the package types listed above. The semiconductor package 500 includes a die pad 502 and a semiconductor die 508 coupled to the die pad 502 by way of a die attach layer 506. An RDL 510 is formed on an active surface of the semiconductor die 508. Example processes for forming the RDLs shown in FIGS. 1A, 2A, 3A, and 4A are described below, and such processes may be readily adapted to form RDLs comprising additional structures, for example, the RDL 510 which has six conductive terminals 516 coupled thereto. Bond wires 526 couple the RDL 510 to conductive terminals 504 (e.g., gullwing style leads).

A mold compound 512 covers the die pad 502, die attach layer 506, semiconductor die 508, RDL 510, bond wires 526, and at least portions of the conductive terminals 504. In examples, the conductive terminals 516 extend from the RDL 510, through the mold compound 512, and into a cavity 514. In examples, the conductive terminals 516 do not extend into the cavity 514 but are exposed to the cavity 514, meaning that the distal ends of the conductive terminals 516 are not covered by the mold compound 512 and thus are accessible from within the cavity 514. For example, as FIG. 5D depicts, the distal ends of the conductive terminals 516 are flush with the bottom surface 515 of the cavity 514, and as FIG. 5E depicts, the distal ends of the conductive terminals 516 are recessed below the bottom surface 515 of the cavity 514. Accessibility to recessed conductive terminals 516 may be improved by using, e.g., reflowed solder connections 599, although such solder bumps may be omitted in some examples.

Referring again to FIG. 5A, six conductive terminals 516 are depicted to illustrate the fact that any desired number of conductive terminals may be used in the various examples described herein. The shapes and sizes of the conductive terminals 516 may vary and may include, for example, any of the shapes and/or sizes of the various conductive terminals described above.

The electronic devices 550, 552, 554 may be of any suitable type, such as those described above (e.g., semiconductor packages, active components, passive components). In examples, the electronic devices 550, 552, 554 are the same type of device, and in other examples, at least one of the electronic devices 550, 552, 554 is different from the remaining electronic devices 550, 552, 554. Conductive terminals 516 couple the electronic devices 550, 552, 554 to the RDL 510, as shown. In examples, poptional bond wires 556 couple the electronic devices 550, 552 to each other. In examples, optional bond wires 558 couple the electronic devices 552, 554 to each other. In this way, the electronic devices 550, 552, 554 may communicate with the semiconductor die 508 via the conductive terminals 516 and the RDL 510; with each other via the bond wires 556, 558; with each other via the conductive terminals 516 and the RDL 510; with the semiconductor die 508 via bond wires 556, 558, the conductive terminals 516, and the RDL 510; and other devices via the bond wires 556, 558 and/or the conductive terminals 516, the RDL 510, bond wires 526, the conductive terminals 504, and a PCB to which the conductive terminals 504 may couple.

Figure 5B:
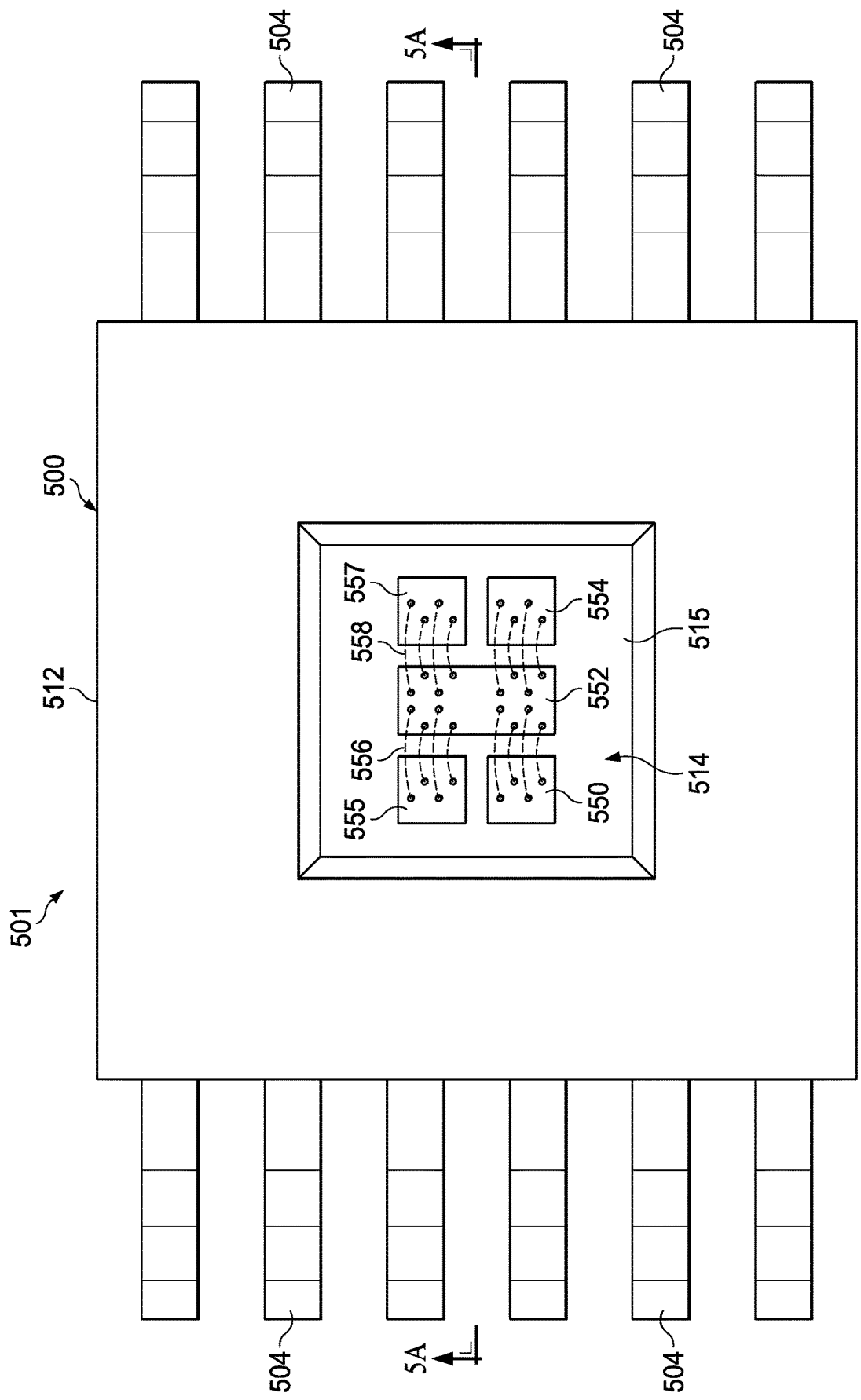
FIG. 5B is a top-down view of a semiconductor package having a cavity storing multiple electronic devices, in accordance with various examples.
Figure 5C:
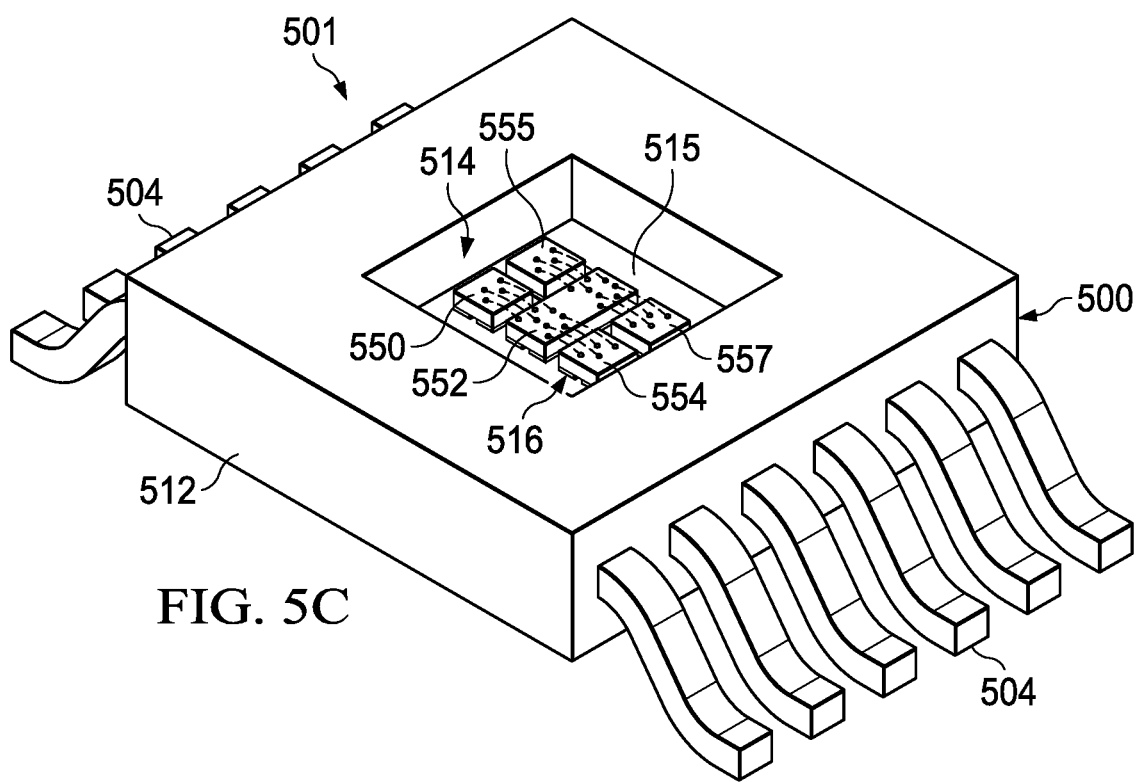
FIG. 5C is a perspective view of a semiconductor package having a cavity storing multiple electronic devices, in accordance with various examples.

FIG. 5B is a top-down view of the semiconductor device 501. As shown, the cavity 514 includes the electronic devices 550, 552, and 554. However, the cavity 514 may also include additional electronic devices 555, 557 that are not visible in the view of FIG. 5A. The various electronic devices 550, 552, 554, 555, and 557 may be the same type of electronic device or may include at least one electronic device that is of a different type than the remaining electronic devices. FIG. 5C is a perspective view of the semiconductor device 501.

Figure 6B:
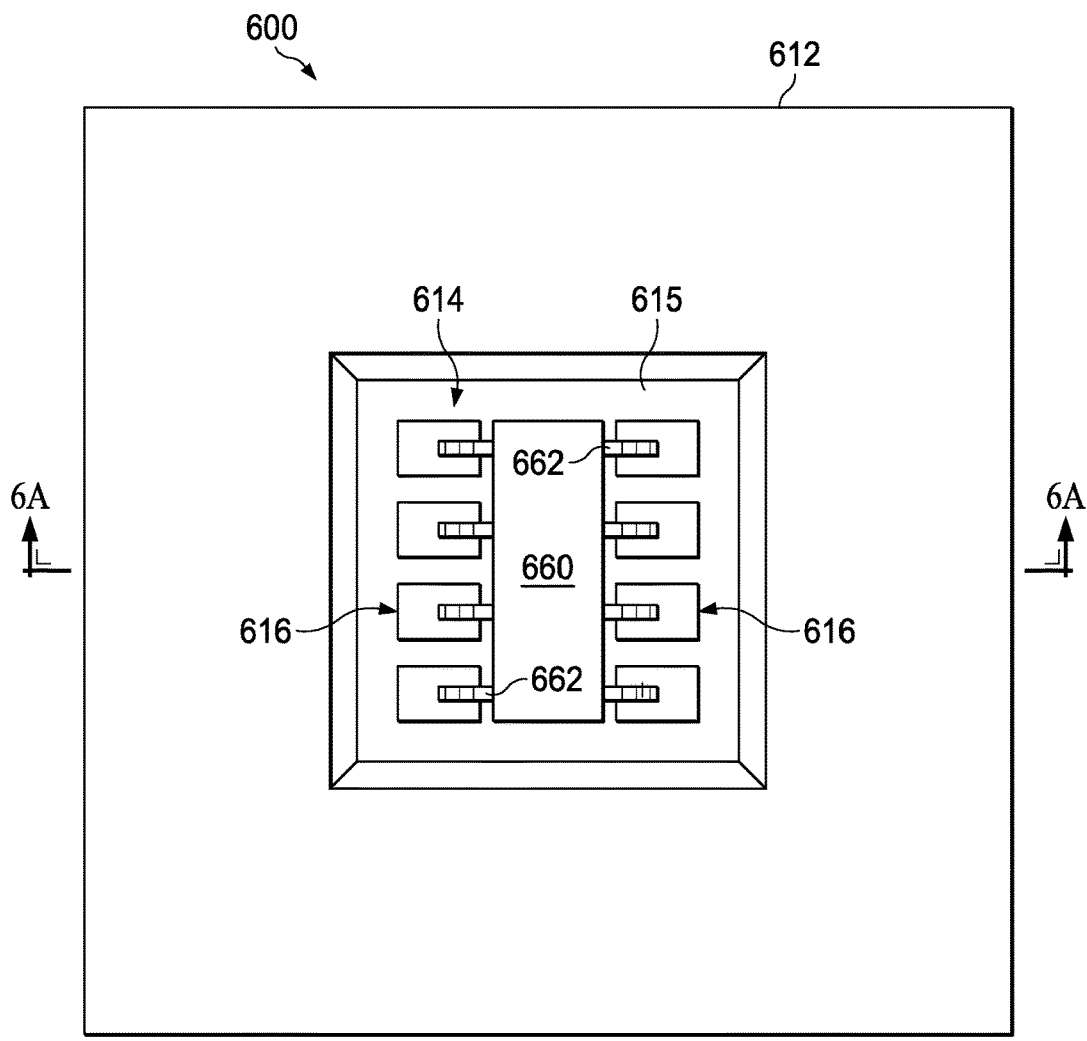
FIG. 6B is a top-down view of a semiconductor package having a cavity storing another semiconductor package, in accordance with various examples.
Figure 6C:
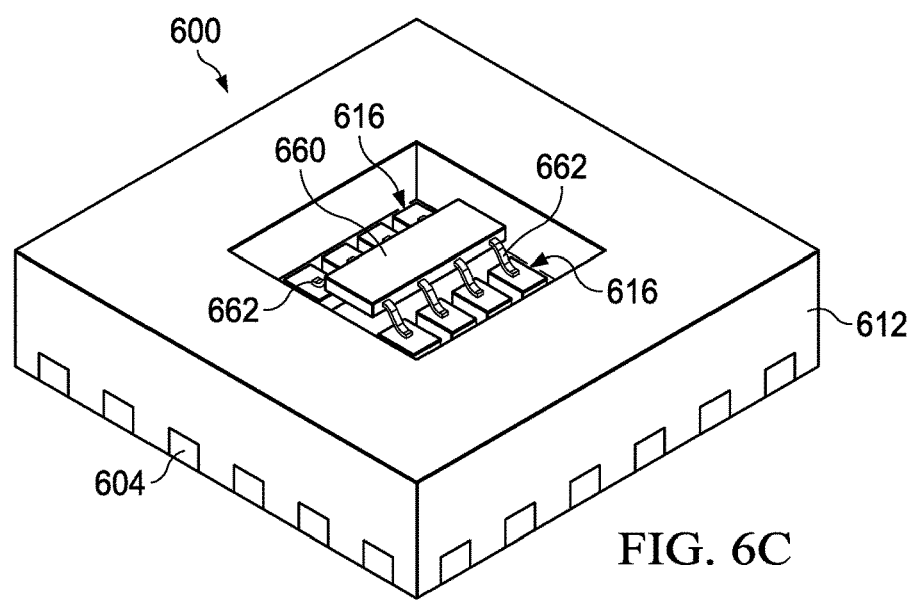
FIG. 6C is a perspective view of a semiconductor package having a cavity storing another semiconductor package, in accordance with various examples.

FIG. 6A is a profile, cross-sectional view of a semiconductor device 601. The semiconductor device 601 includes a semiconductor package 600 and an electronic device 660. The semiconductor package 600 is similar to the semiconductor package 100, with like numerals referring to like components, except that it has additional conductive terminals, as described below. The example electronic device 660 comprises a semiconductor package, for example a DIP with gullwing style conductive terminals. Conductive terminals 662 of the electronic device 660 couple to conductive terminals 616. In this way, the circuitry (e.g., formed on a semiconductor die) within the electronic device 660 is able to communicate with the active surface of a semiconductor die 608 via the conductive terminals 662, 616 and an RDL 610. In addition, the electronic device 660 may communicate with other devices, for example via the conductive terminals 662, 616, the RDL 610, bond wires 626, and conductive terminals 604, which may couple to a PCB on which such other devices may be mounted. FIG. 6B depicts a top-down view of the semiconductor device 601. FIG. 6C depicts a perspective view of the semiconductor device 601.

Figure 7:
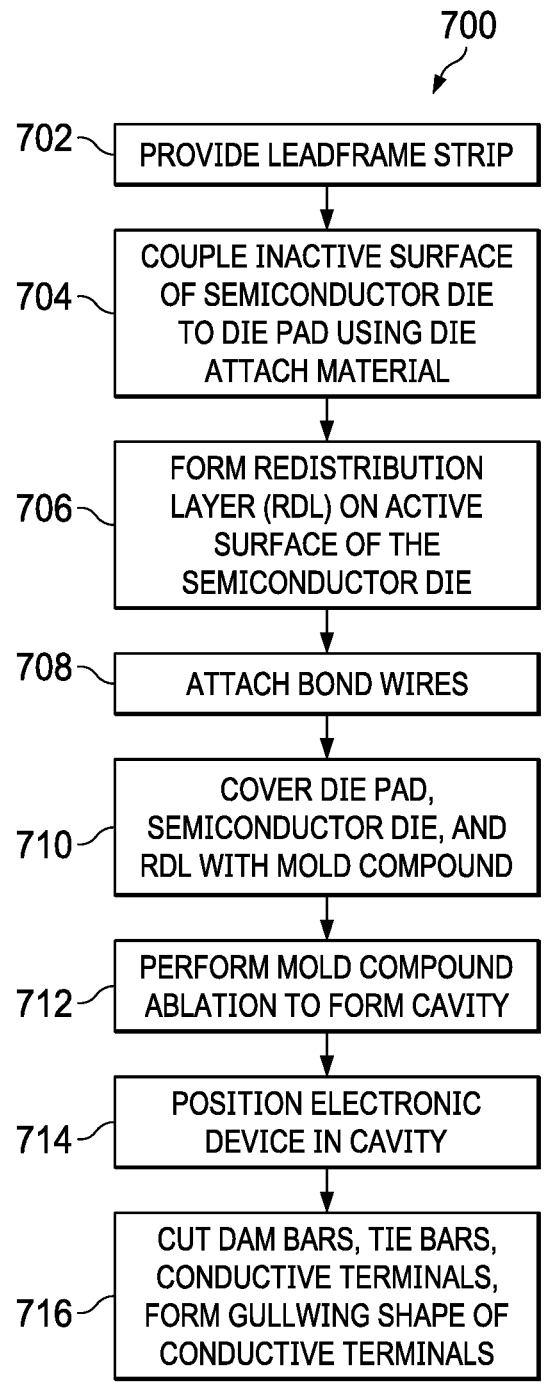
FIG. 7 is a flow diagram of a method for fabricating a semiconductor device comprising a semiconductor package having a cavity to store an electronic device, in accordance with various examples.

FIG. 7 is a flow diagram of a method 700 for fabricating a semiconductor device comprising a semiconductor package having a cavity to store an electronic device, in accordance with various examples. The method 700 may be used, for example, to fabricate the various semiconductor devices and/or packages described above. The method 700 begins with providing a leadframe strip (702). An inactive surface of a semiconductor die is coupled to a die pad of a leadframe in the leadframe strip using die attach material (704). The method 700 comprises forming an RDL on an active surface of the semiconductor die (706). FIGS. 8A-8F, 9A-9E2, 10A-10G, and 11A-11G provide example process flows for the fabrication of an RDL and are now described in turn, followed by a description of the remainder of the method 700.

Figure 8A:
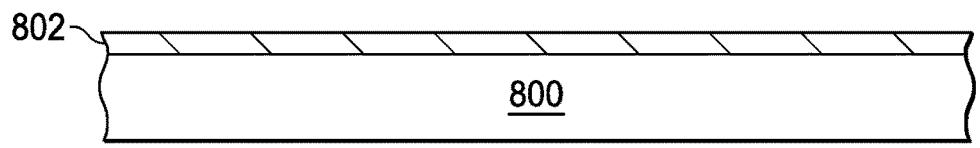
FIGS. 8A-8F depict a process flow for fabricating a redistribution layer (RDL) in a semiconductor package having a cavity to store an electronic device, in accordance with various examples.
Figure 8B:
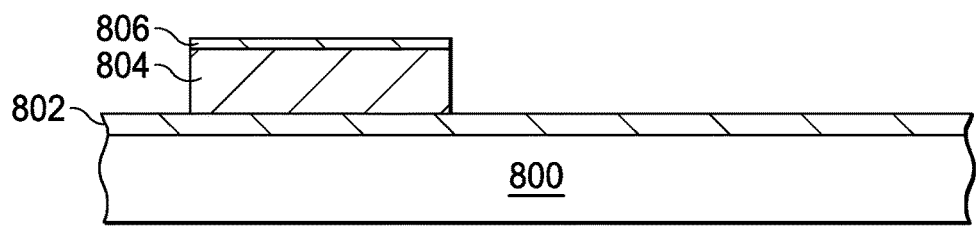
Figure 8C:
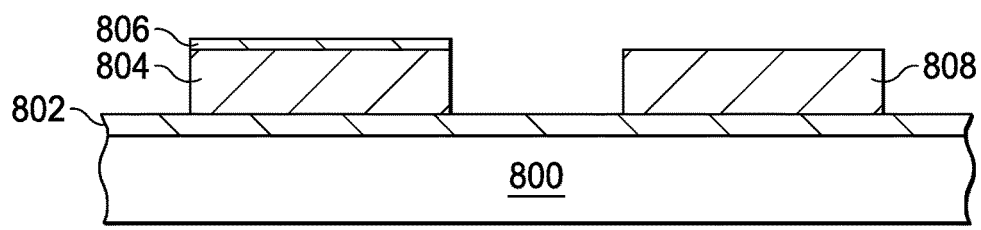

The structure of FIG. 8A is the result of providing a semiconductor die 800 and positioning (e.g., sputtering) a seed layer 802 (e.g., titanium tungsten or copper) on an active surface of the semiconductor die 800. The structure of FIG. 8B is the result of applying a photoresist coat (not expressly shown), exposing the photoresist coat using an appropriately patterned mask, developing the photoresist coat, plating (e.g., electroplating) a metal layer 804 (e.g., a copper layer), plating a plating layer 806 (e.g., nickel palladium, nickel tungsten) on a distal end of the metal layer 804, and stripping the photoresist coat. The structure of FIG. 8C is the result of applying a photoresist coat (not expressly shown), exposing the photoresist coat using an appropriately patterned mask, developing the photoresist coat, plating a metal layer 808 (e.g., a copper layer), and stripping the photoresist coat.

Figure 8D:
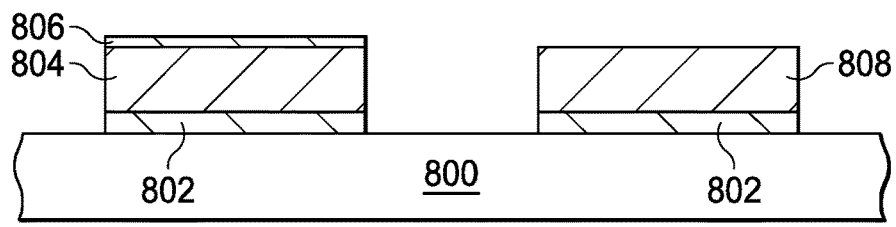
Figure 8E:
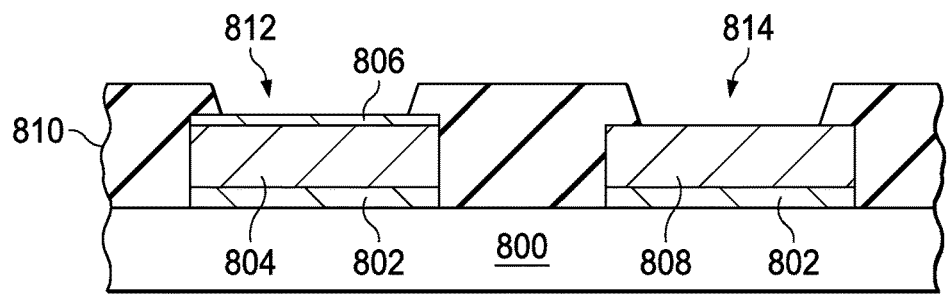
Figure 8F:
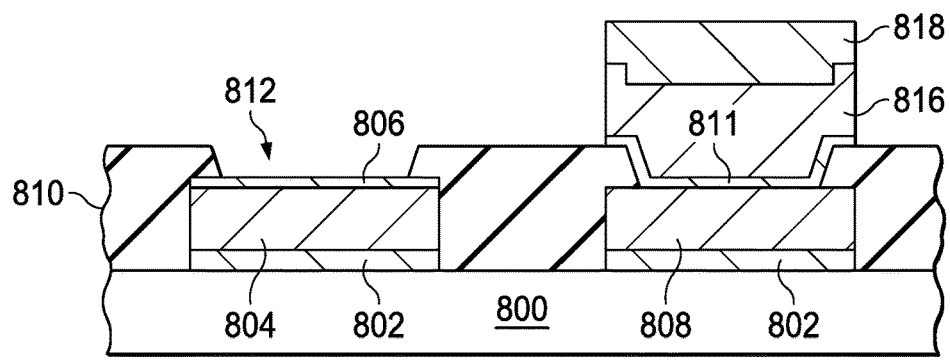

The structure depicted in FIG. 8D is formed by removing (e.g., etching away) the seed layer 802, except for the portions of the seed layer 802 positioned under the metal layers 804, 808. The structure depicted in FIG. 8E is formed by applying a polyimide coat 810, exposing the polyimide coat 810 using a suitably patterned mask, developing the polyimide coat 810 to form orifices 812, 814, performing a post-develop bake (PDB) on the structure, and curing the structure. The structure depicted in FIG. 8F is formed by depositing (e.g., sputtering) a seed layer 811 (only a portion of which is shown in FIG. 8F) on the polyimide coat 810, the plating layer 806, and the metal layer 808. The seed layer 811 may comprise, for example, titanium tungsten or copper. The structure depicted in FIG. 8F is further formed by applying a photoresist coat (not expressly shown), exposing the photoresist coat using a suitably patterned mask, developing the photoresist coat, plating a metal post 816 (e.g., copper), plating a plating layer 818 (e.g., tin silver) on a distal end of the metal post 816, and stripping the remaining photoresist coat. The structure depicted in FIG. 8F has also had the seed layer 811 removed (e.g., etched) except for the portion of the seed layer 811 shown remaining in FIG. 8F. The plating layer 818 may subsequently be reflowed to facilitate coupling of the metal post 816 with an electronic device, such as the electronic devices described above. Although this description assumes the use of polyimide (e.g., polyimide coat 810), in some examples, polybenzoxazole (PBO) may be used instead of polyimide. In FIG. 8F, the metal layer 804 may correspond to, e.g., the metal layers 220 (FIG. 2A), 320 (FIG. 3A), and 420 (FIG. 4A) described above, while the metal layer 808 may correspond to, e.g., the metal layers 230 (FIG. 2A), 330 (FIG. 3A), and 430 (FIG. 4A) described above.

Figure 9A:
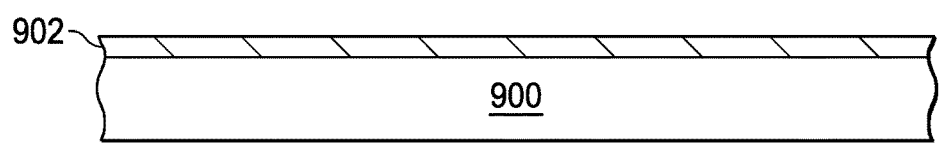
Figure 9B:
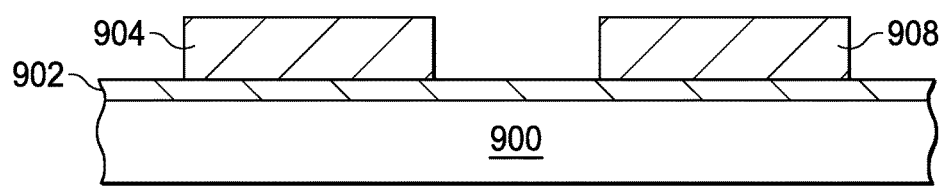

The structure of FIG. 9A is the result of applying (e.g., sputtering) a seed layer 902 to an active surface of a semiconductor die 900, as shown. In examples, the seed layer 902 comprises titanium tungsten or copper. To form the structure of FIG. 9B, a photoresist coat (not expressly shown) is applied, the photoresist coat is exposed using a suitably patterned mask (not expressly shown), the photoresist coat is developed, and metal layers 904, 908 (e.g., copper) are plated. The photoresist coat is then removed. To form the structure of FIG. 9C, the remaining seed layer 902 is etched away, except for the portions of the seed layer 902 positioned below the metal layers 904, 908.

To form the structure of FIG. 9D, a polyimide coat 910 is applied, exposed using a suitably patterned mask (not expressly shown), and developed to produce the shape of the polyimide coat 910 shown, including orifices 912, 914. The polyimide coat 910 may also be subjected to a post-develop baking (PDB) process and a curing process. To produce the structure of FIG. 9E, another seed layer 911 is deposited (e.g., sputtered). A photoresist coat (not expressly shown) is applied, exposed using a suitably patterned mask (not expressly shown), and developed. A plating layer 906 is added using, e.g., a nickel palladium or nickel tungsten electroplating process, and the remaining photoresist coat is then removed. In addition, another photoresist coat (not expressly shown) is applied, exposed using a suitably patterned mask (not expressly shown), and developed. A metal post 916 (e.g., copper) is formed using, e.g., an electroplating process, and the metal post 916 is capped on a distal end with a plating layer 918, which may be formed using a tin silver electroplating process, for example. The metal post 916 and the plating layer 918 together form a conductive terminal. The remaining seed layer 911 is etched away except for the portions shown remaining under the plating layer 906 and the metal post 916. Although this description assumes the use of polyimide in the polyimide coat 910, in some examples, polybenzoxazole may be used instead of polyimide.

The plating layer 906, like other metal and plating layers described herein, may be shaped and/or sized differently than shown, for example by adjusting the mask pattern used to develop a corresponding photoresist coat. For instance, as FIG. 9E1 depicts, the mask may be formed so that the underlying photoresist coat has a narrower opening in which to plate the plating layer 906, producing a narrower plating layer 906. In examples, as FIG. 9E2 depicts, the mask may be formed so that the underlying photoresist coat has a wider opening in which to plate the plating layer 906, producing a wider plating layer 906. In FIGS. 9E, the metal layer 904 may correspond to, e.g., the metal layers 220 (FIG. 2A), 320 (FIG. 3A), and 420 (FIG. 4A) described above, while the metal layer 908 may correspond to, e.g., the metal layers 230 (FIG. 2A), 330 (FIG. 3A), and 430 (FIG. 4A) described above.

Figure 10A:
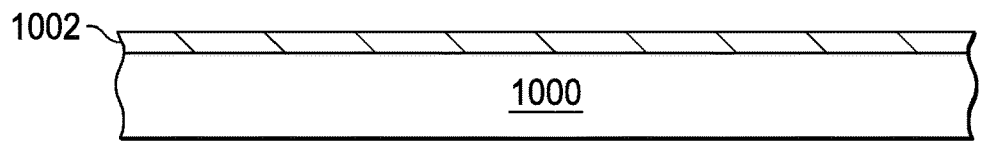
FIGS. 10A-10G depict a process flow for fabricating a redistribution layer (RDL) in a semiconductor package having a cavity to store an electronic device, in accordance with various examples.
Figure 10B:
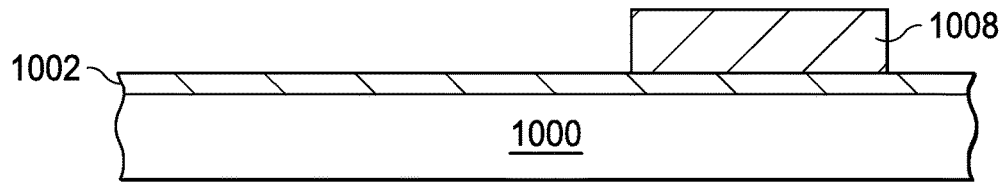
Figure 10C:
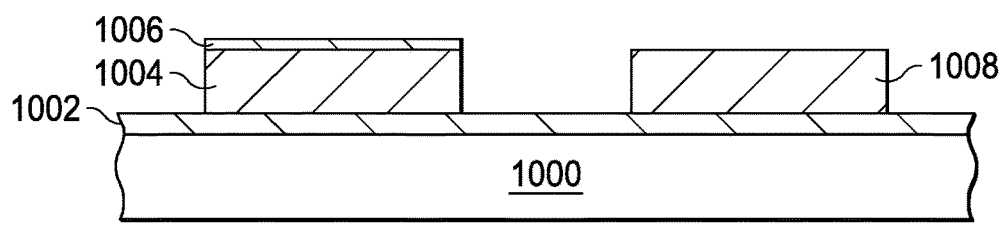
Figure 10D:
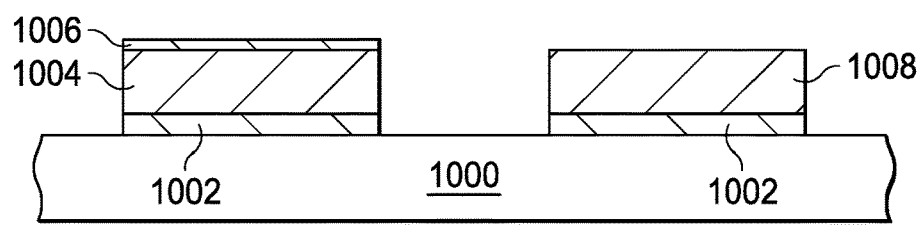
Figure 10E:
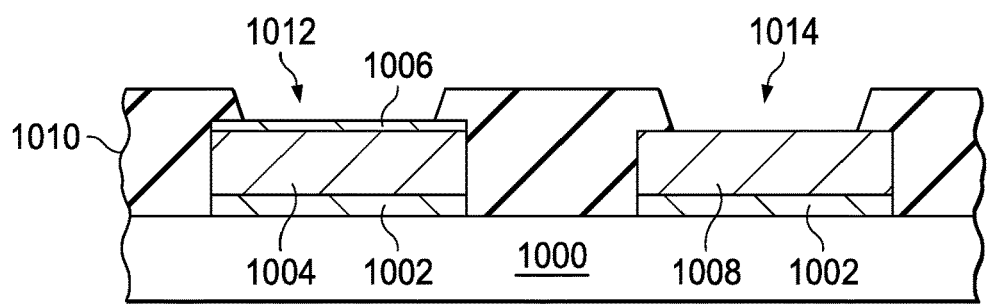
Figure 10F:
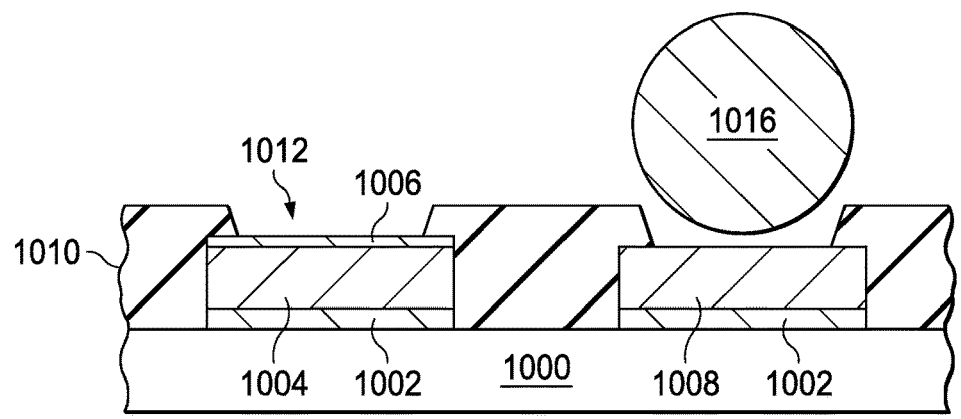
Figure 10G:
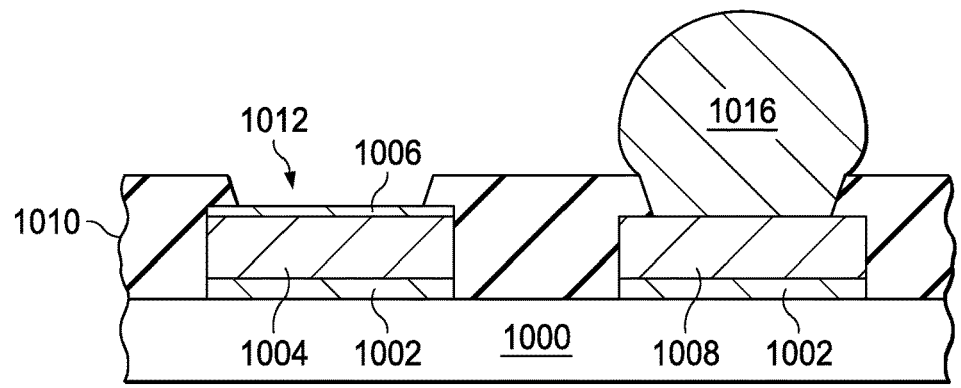

The process flow depicted in FIGS. 10A-10E is similar to that depicted in FIGS. 8A-8E, with like numerals referring to like components (e.g., semiconductor die 1000 is similar to semiconductor die 800, seed layer 1002 is similar to seed layer 802, and so on). In examples, FIG. 10B differs from FIG. 8B in that a metal layer 1008 is shown as being formed prior to a metal layer 1004, while in FIG. 8B, the metal layer 804 is being shown formed before the metal layer 808. For both FIGS. 8B and 10B, either possibility falls within the scope of this disclosure. In FIG. 10F, a conductive terminal 1016, specifically, a metal sphere (e.g., solder ball), is shown being positioned on the metal layer 1008. In FIG. 10G, the conductive terminal 1016 is coupled to the metal layer 1008.

The conductive terminal 1016 may be reflowed to couple the conductive terminal 1016 to the metal layer 1008, and it may be subsequently reflowed again to couple the conductive terminal 1016 to an electronic device as described above. In FIG. 10G, the metal layer 1004 may correspond to, e.g., the metal layers 220 (FIG. 2A), 320 (FIG. 3A), and 420 (FIG. 4A) described above, while the metal layer 1008 may correspond to, e.g., the metal layers 230 (FIG. 2A), 330 (FIG. 3A), and 430 (FIG. 4A) described above.

Figure 11A:
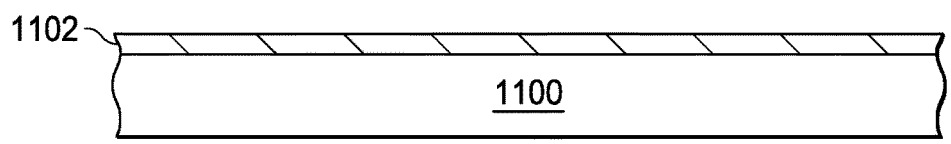
FIGS. 11A-11G depict a process flow for fabricating a redistribution layer (RDL) in a semiconductor package having a cavity to store an electronic device, in accordance with various examples.
Figure 11B:
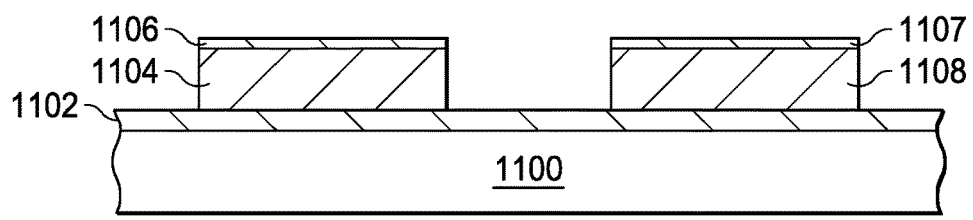
Figure 11C:
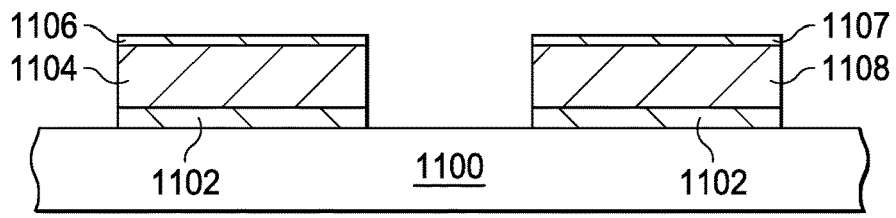

To produce the structure of FIG. 11A, a seed layer 1102 (e.g., titanium tungsten, copper) is deposited on a semiconductor die 1100. To produce the structure of FIG. 11B, a photoresist coat (not expressly shown) is applied, exposed using a suitably patterned mask (not expressly shown), and developed. Metal layers 1104, 1108 (e.g., copper layers) are then plated, and plating layers 1106, 1107 (e.g., nickel palladium, nickel tungsten) are positioned on the distal ends of the metal layers 1104, 1108, as shown. The photoresist coat is then removed. To produce the structure of FIG. 11C, portions of the seed layer 1102 are etched away, as shown.

Figure 11D:
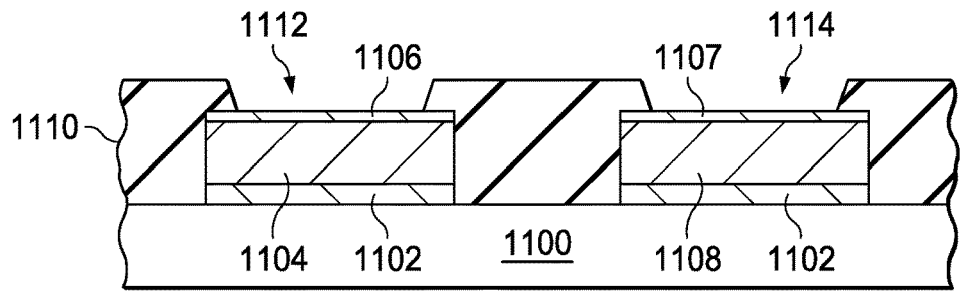
Figure 11E:
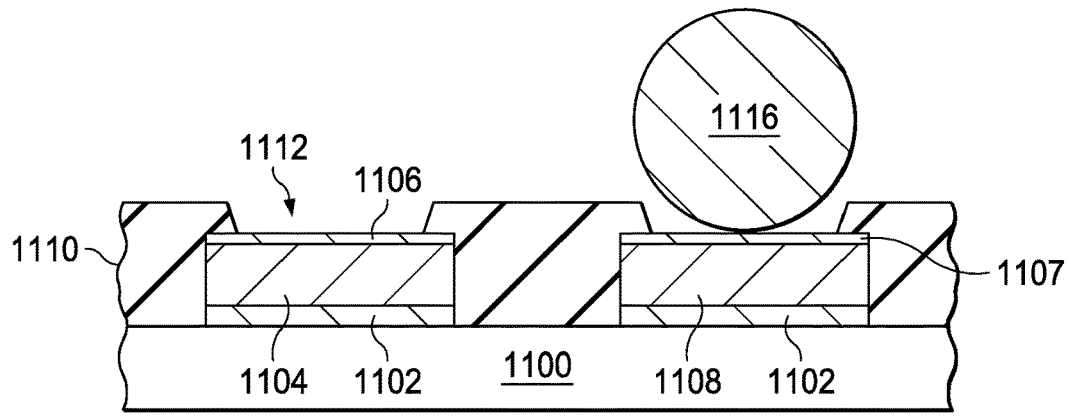
Figure 11F:
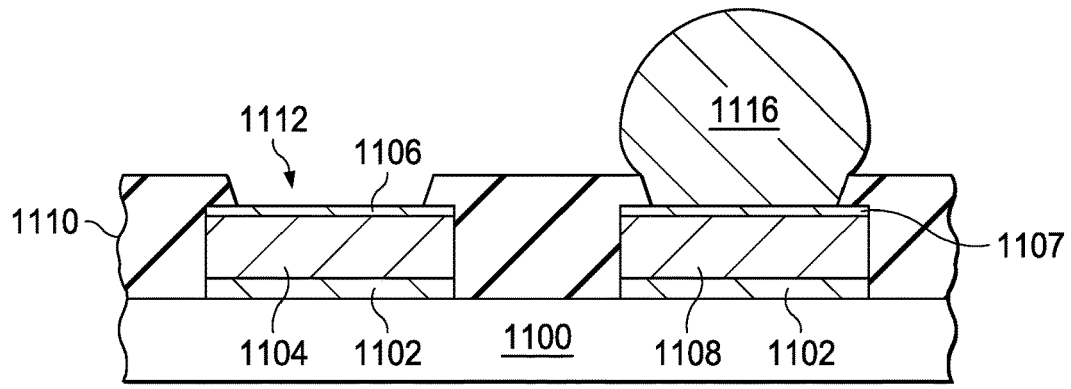

To produce the structure of FIG. 11D, a polyimide coat 1110 is applied, exposed using a suitably patterned mask (not expressly shown), and developed to form the shape shown, including orifices 1112, 1114. In examples, a PDB process and a curing process are performed on the polyimide coat 1110. A conductive terminal 1116 (e.g., a metal sphere, such as a solder ball) is then positioned on the plating layer 1107, as shown in FIG. 11E, and the conductive terminal 1116 is reflowed to couple to the plating layer 1107. The conductive terminal 1116 may again be subsequently reflowed to couple to an electronic device, as described above. Although this description assumes the use of polyimide for the polyimide coat 1110, in some examples, polybenzoxazole may be used instead of polyimide. In FIG. 11F, the metal layer 1104 may correspond to, e.g., the metal layers 220 (FIG. 2A), 320 (FIG. 3A), and 420 (FIG. 4A) described above, while the metal layer 1108 may correspond to, e.g., the metal layers 230 (FIG. 2A), 330 (FIG. 3A), and 430 (FIG. 4A) described above.

The example process flows shown in FIGS. 8A-11G may be used to form, e.g., portions of any of the RDLs mentioned herein (e.g., RDL 110, the RDLs depicted in FIGS. 2A, 3A, and 4A, RDL 510, RDL 610). For example, the metal layers 804, 904, 1004, and 1104 in FIGS. 8F, 9E, 10G, and 11F, respectively, may correspond to one of the metal layers 220 shown in FIGS. 2A, 3A, and 4A. Similarly, the metal layers 808, 908, 1008, and 1108 in FIGS. 8F, 9E, 10G, and 11F, respectively, may correspond to one of the metal layers 230 shown in FIGS. 2A, 3A, and 4A. The scope of disclosure is not limited to the RDL metal layers and patterns depicted herein. A range of metal layers and patterns are contemplated and included in the scope of this disclosure.

Figure 11G:
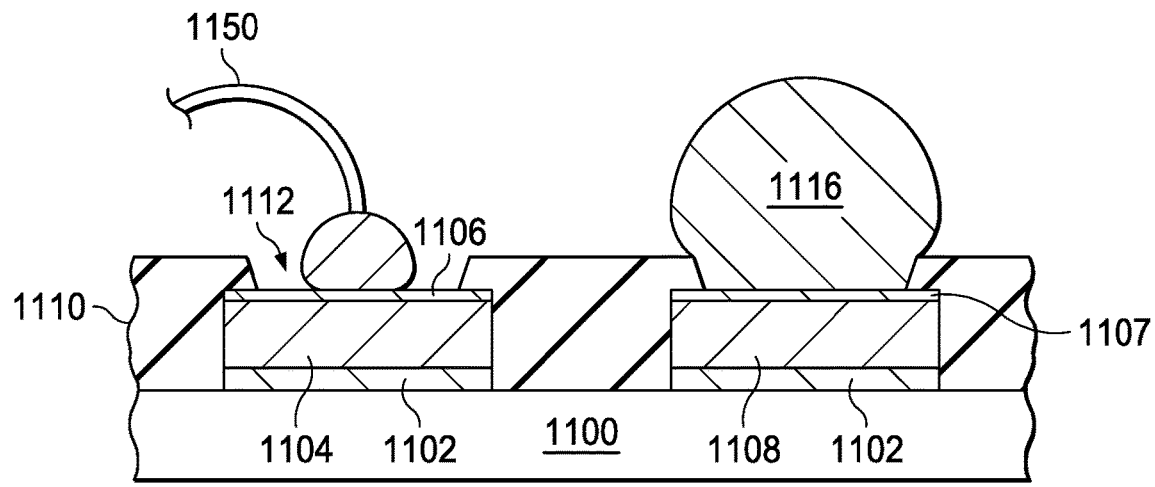

Returning now to FIG. 7, after the RDL has been formed on an active surface of the semiconductor die (706), the method 700 comprises coupling a bond wire from a conductive terminal in the RDL to a conductive terminal of the lead frame (708), for instance, using the bond wire 1150 shown in FIG. 11G. The method 700 subsequently comprises covering the die pad, semiconductor die, and RDL with mold compound (710); ablating (e.g., using a laser) the mold compound to form a cavity, such as the various cavities described above (712); positioning an electronic device within the cavity as described above (714); and cutting dam bars, tie bars, and conductive terminals of the lead frame, as well as forming a gullwing shape for the conductive terminals of the lead frame (716).

Figure 12A:
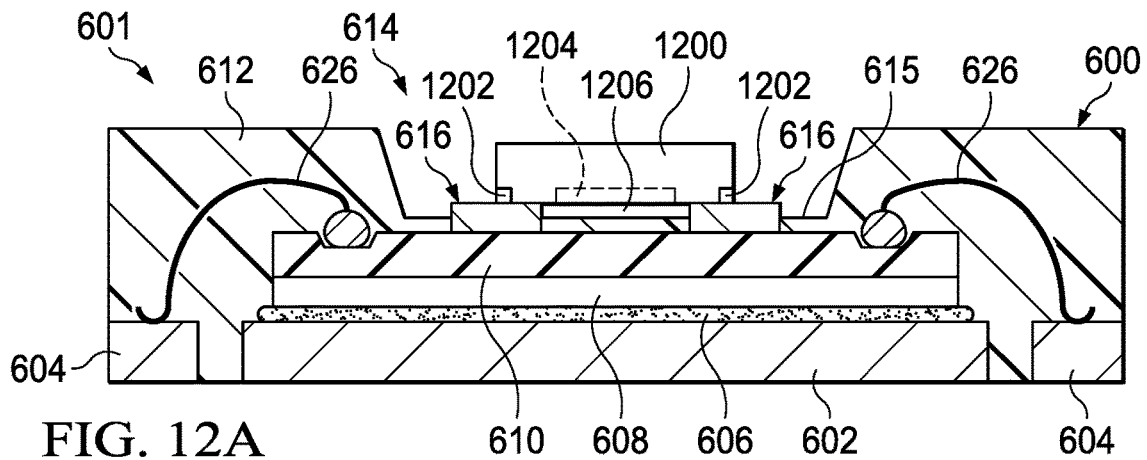
FIGS. 12A-12C depict profile cross-sectional, top-down, and perspective views of a semiconductor package having a cavity to store a quad flat no lead (QFN) style semiconductor package, in accordance with various examples.
Figure 12B:
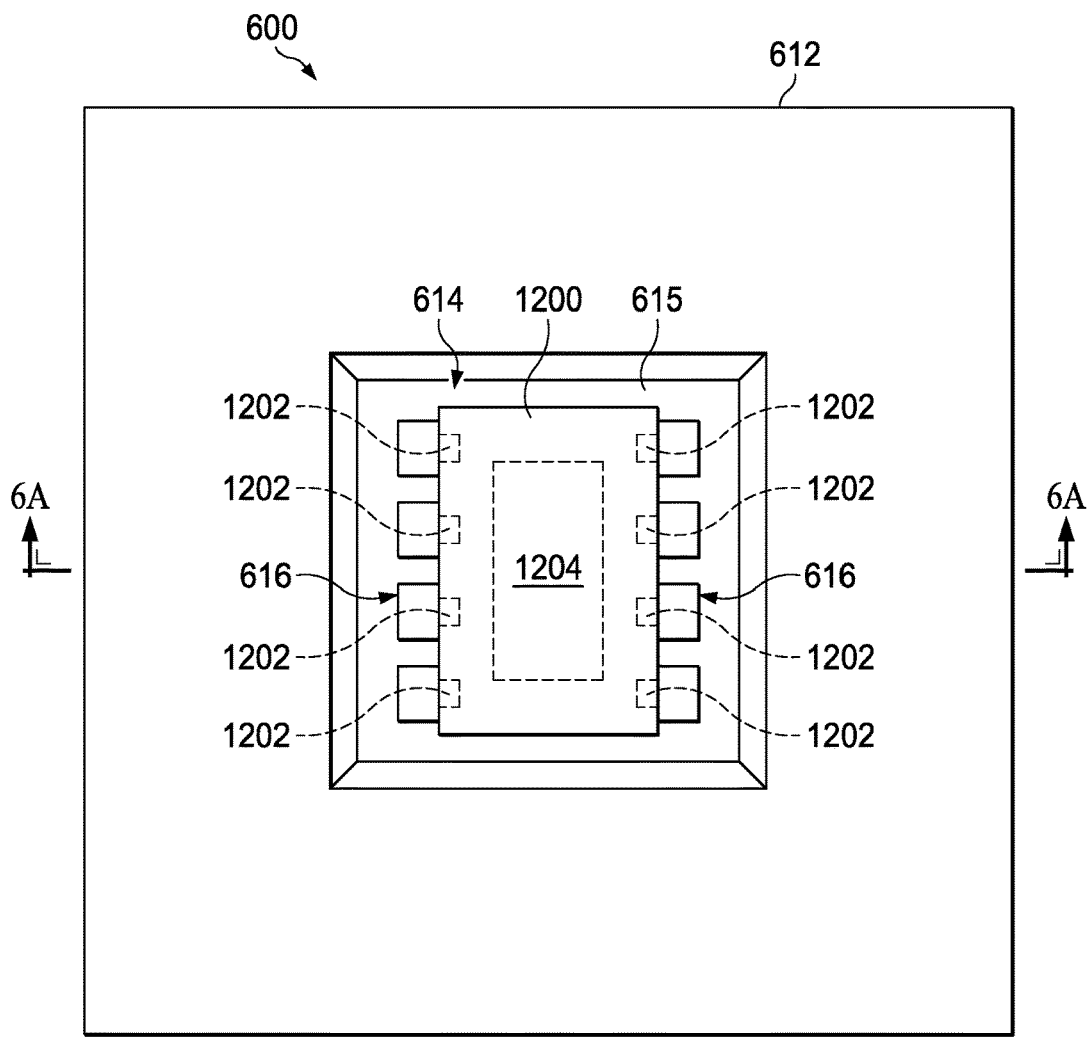
Figure 12C:
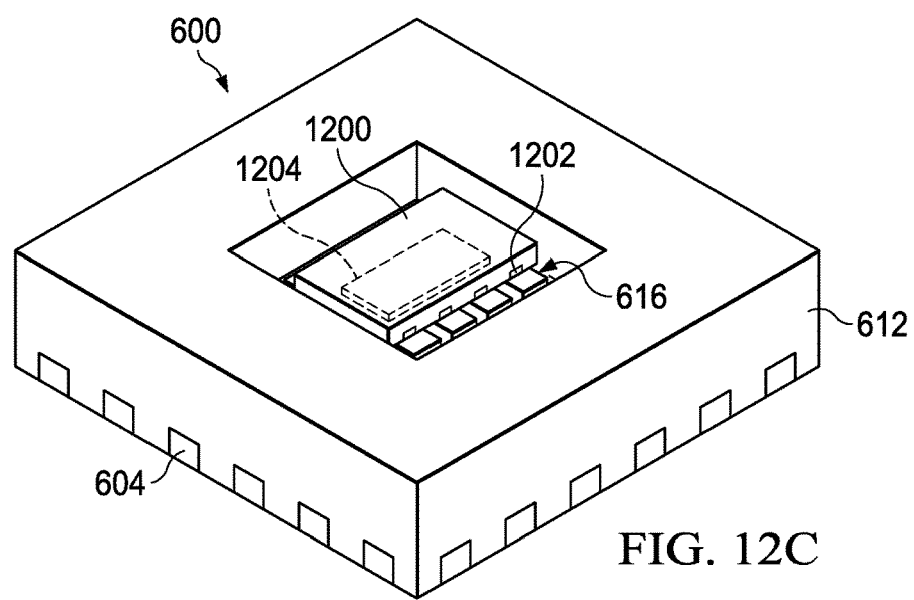

FIGS. 12A-12C depict profile cross-sectional, top-down, and perspective views of a semiconductor package having a cavity to store a quad flat no lead (QFN) style semiconductor package, in accordance with various examples. In particular, the example structure of FIG. 12A is identical to that of FIG. 6A, except that the electronic device 660 is replaced by an electronic device 1200, which, in examples, is a QFN style semiconductor package. The electronic device 1200 includes conductive terminals 1202 that couple to the conductive terminals 616. The electronic device 1200 includes a die pad 1204 that is exposed to a bottom surface of the electronic device 1200, thereby providing superior heat dissipation into the empty space 1206. FIGS. 12B and 12C show top-down and perspective views of the structure of FIG. 12A, respectively.

The examples described herein are advantageous over stacked package configurations for multiple reasons. For example, as explained above, because an electronic device partially or entirely fits within the cavity of the semiconductor package, the volume of the resulting structure is the same as, or is not substantially greater than, the volume of the semiconductor package alone. In addition, the semiconductor device is inexpensive and efficient to manufacture. Furthermore, electrical signals are exchanged between the electronic device and the semiconductor package by way of a redistribution layer (RDL) positioned between the electronic device and the semiconductor die of the semiconductor package, thereby mitigating significant increases in distance traveled by the electrical signals and preserving electrical performance. Further still, because the electronic device is positioned within the cavity of the semiconductor package, both the electronic device and the semiconductor package are able to efficiently dissipate heat.

These advantages cannot be realized by traditional or even modified open cavity packages, as these types of packages are specifically designed for unpackaged semiconductor dies to be positioned in therein. Open cavity packages typically include exposed die pads on which semiconductor dies are mounted and wirebonded to conductive terminals (e.g., leads) that are inside the cavity. After this is done, however, the cavity must be covered by a mold compound to protect the exposed integrated circuit formed on the semiconductor die and the bond wires coupled to the integrated circuit. Modifying such an open cavity package with conductive terminals extending into the cavity from a bottom surface of the cavity is not helpful, as the integrated circuit of the semiconductor die will be facing away from the bottom surface of the cavity and thus will be unable to couple to such conductive terminals. Even in a flip-chip configuration, the integrated circuit would not be able to couple to both the conductive terminals extending from the bottom surface of the cavity and the conductive terminals (e.g., leads) arranged around the perimeter of the cavity. In contrast, the examples described herein include uncovered cavities. Examples described herein also include cavities that omit conductive terminals (e.g., leads) arranged around a perimeter of the cavity. As such, the cavities of the examples described herein are suitable for packages (as opposed to unpackaged semiconductor dies) and passive components that would be unsuitable for open cavity packages. In addition, the uncovered cavities described herein provide extra volume that may be occupied by additional electronic devices (e.g., packages, passive components) instead of being occupied by mold compound, which would be needed in a traditional or modified open cavity package. Further still, the uncovered cavities described herein enable additional heat dissipation that would not be possible with open cavity packages, which are subsequently covered to protect the unpackaged semiconductor die mounted inside the cavity.

In the foregoing discussion and in the claims, the terms "including" and "comprising" are used in an open-ended fashion, and thus should be interpreted to mean "including, but not limited to . . . ." Also, the term "couple" or "couples" is intended to mean either an a direct connection (whether mechanical or electrical) or an indirect electrical connection. Thus, if a first device couples to a second device, that connection may be through a direct mechanical connection, a direct electrical connection, or an indirect electrical connection via other devices and connections. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A semiconductor device, comprising:
a semiconductor package including a mold compound covering a semiconductor die, the semiconductor package having a surface and a cavity in the surface, the semiconductor die having a device side facing the cavity, the device side having circuitry therein; and
an electronic device positioned within the cavity, the electronic device coupled to the semiconductor die via a conductive terminal extending through the mold compound, the conductive terminal having a first end physically contacting the device side and a second end extending into the cavity, and wherein the conductive terminal comprises a copper post, and wherein the electronic device includes another semiconductor die.

2. The semiconductor device of claim 1, wherein the conductive terminal extends into the cavity via a bottom surface of the cavity, and wherein the cavity is uncovered.

3. The semiconductor device of claim 1, further comprising a tin silver plating on an end of the copper post distal to the semiconductor package.

4. The semiconductor device of claim 2, wherein the conductive terminal comprises a solder ball.

5. The semiconductor device of claim 1, wherein the electronic device comprises a passive electronic device.

6. The semiconductor device of claim 1, further comprising a redistribution layer (RDL) between the semiconductor die and the surface of the semiconductor package.

7. The semiconductor device of claim 6, wherein the RDL comprises a copper layer plated with a nickel palladium layer or a nickel tungsten layer.

8. The semiconductor device of claim 6, wherein the RDL abuts one of a polyimide coat and a polybenzoxazole layer.

9. A semiconductor device, comprising:
a semiconductor die;
a die pad supporting the semiconductor die;
a mold compound covering the semiconductor die and the die pad, the semiconductor die positioned between the die pad and a surface of the mold compound, a cavity in the surface of the mold compound;
a conductive terminal physically contacting a bond pad of the semiconductor die, the conductive terminal extending through the surface of the mold compound and into the cavity; and
an electronic device including another semiconductor die, the electronic device placed in the cavity and coupled to the conductive terminal.

10. The semiconductor device of claim 9, wherein the conductive terminal comprises a metal post.

11. The semiconductor device of claim 9, wherein the conductive terminal comprises a solder ball.

12. The semiconductor device of claim 9, further comprising multiple electronic devices positioned in the cavity and coupled to the conductive terminal.

13. The semiconductor device of claim 12, wherein the multiple electronic devices are positioned entirely inside the cavity such that the multiple electronic devices do not extend beyond a plane of the surface of the mold compound.

14. The semiconductor device of claim 9, wherein the conductive terminal couples to the semiconductor die via a redistribution layer.

15. The semiconductor device of claim 14, wherein the redistribution layer comprises a metal layer coupled to a plating layer.

16. A semiconductor device, comprising:
a semiconductor die;
a redistribution layer (RDL) coupled to the semiconductor die, the redistribution layer including bond pads of the semiconductor die;
first and second conductive terminals physically contacting a respective one of the bond pads;
a mold compound covering the semiconductor die and the redistribution layer, the mold compound including a cavity, wherein top surfaces of the first and second conductive terminals are positioned between the RDL and a bottom surface of the cavity;
a first electronic device coupled to the first conductive terminal and positioned inside the cavity; and
a second electronic device coupled to the second conductive terminal and positioned inside the cavity.

17. The semiconductor device of claim 16, wherein each of the first and second conductive terminals is selected from the group consisting of: a copper post plated with a tin silver layer, and a solder ball coupled to a copper layer plated with a nickel palladium layer or a nickel tungsten layer.

* * * * *